(12) United States Patent
Kim et al.

(10) Patent No.: US 10,437,514 B2
(45) Date of Patent: Oct. 8, 2019

(54) APPARATUSES AND METHODS INCLUDING MEMORY COMMANDS FOR SEMICONDUCTOR MEMORIES

(71) Applicant: MICRON TECHNOLOGY, INC., Boise, ID (US)

(72) Inventors: Kang-Yong Kim, Boise, ID (US); Hyun Yoo Lee, Boise, ID (US); John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 15/722,769

(22) Filed: Oct. 2, 2017

(65) Prior Publication Data
US 2019/0102109 A1   Apr. 4, 2019

(51) Int. Cl.
*G06F 3/06* (2006.01)
*G11C 11/408* (2006.01)
*G11C 11/4076* (2006.01)
*G11C 11/4074* (2006.01)

(52) U.S. Cl.
CPC .......... *G06F 3/0659* (2013.01); *G06F 3/0611* (2013.01); *G06F 3/0679* (2013.01); *G11C 11/4074* (2013.01); *G11C 11/4076* (2013.01); *G11C 11/4085* (2013.01); *G11C 11/4087* (2013.01)

(58) Field of Classification Search
CPC .... G06F 3/0611; G06F 3/0659; G06F 3/0679; G11C 11/4074; G11C 11/4076; G11C 11/4085; G11C 11/4087
USPC .......................... 365/233.1, 233.11; 711/167
See application file for complete search history.

(56) References Cited

U.S. PATENT DOCUMENTS

| | | | |
|---|---|---|---|
| 6,337,833 B1 | 1/2002 | Kanazashi et al. | |
| 2002/0039324 A1 | 4/2002 | Lee | |
| 2004/0103226 A1 | 5/2004 | Johnson et al. | |
| 2008/0232179 A1* | 9/2008 | Kwak | G11C 7/1051 365/194 |
| 2010/0054059 A1* | 3/2010 | Yoon | G11C 7/1072 365/194 |
| 2010/0182856 A1 | 7/2010 | Koshizuka | |

(Continued)

OTHER PUBLICATIONS

International Search Report and Written Opinion dated Jan. 28, 2019 for PCT Application No. PCT/US2018/053578, 16 pages.

(Continued)

*Primary Examiner* — Gary J Portka
(74) *Attorney, Agent, or Firm* — Dorsey & Whitney LLP

(57) ABSTRACT

Apparatuses and methods including memory commands for semiconductor memories are described. An example method includes receiving a data clock signal responsive to receiving a timing command, performing an access operation responsive to receiving an access command associated with the timing command, providing an access data clock signal based on the data clock signal, and providing an access data clock signal based on the data clock signal. The access command may be separated in time from the associated timing command by at least one clock cycle of a system clock signal. In some examples, the access command may precede the associated timing command or may follow the associated timing command. In some examples, the access command may immediately follow or precede the associated timing command.

27 Claims, 13 Drawing Sheets

(56) References Cited

U.S. PATENT DOCUMENTS

| | | |
|---|---|---|
| 2010/0195421 A1 | 8/2010 | Jeddeloh |
| 2012/0113729 A1* | 5/2012 | Mochizuki .......... G06F 13/1673 365/189.05 |
| 2012/0268655 A1 | 10/2012 | Macinnis et al. |
| 2014/0266320 A1 | 9/2014 | Conrow et al. |
| 2014/0293727 A1 | 10/2014 | Nakamura et al. |
| 2015/0317096 A1 | 11/2015 | Bains |
| 2015/0340072 A1 | 11/2015 | Mazumder |
| 2016/0118094 A1 | 4/2016 | Hyun et al. |
| 2017/0110173 A1 | 4/2017 | Matsuno et al. |

OTHER PUBLICATIONS

PCT Application No. PCT/US2018/044126, titled "Apparatuses and Methods Including Memory Commands for Semiconductor Memories" filed Jul. 27, 2018.

U.S. Appl. No. 16/035,414, titled "Apparatuses and Methods Including Memory Commands for Semiconductor Memories", filed Jul. 13, 2018.

U.S. Appl. No. 16/035,452, titled "Apparatuses and Methods Including Memory Commands for Semiconductor Memories", filed Jul. 13, 2018.

U.S. Appl. No. 16/413,475 titled "Apparatuses and Methods Including Memory Commands for Semiconductor Memories" filed May 15, 2019.

\* cited by examiner

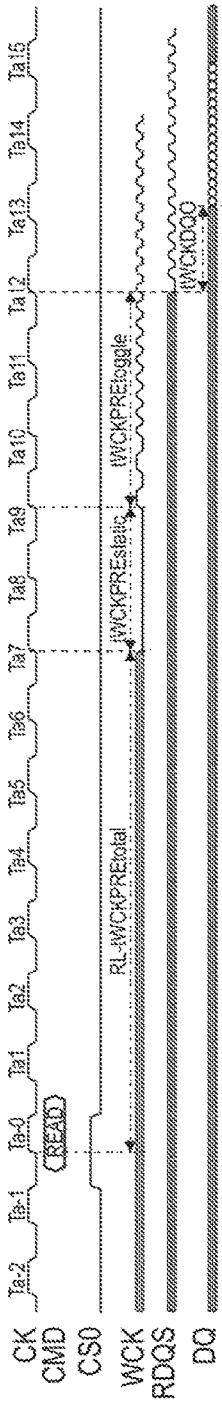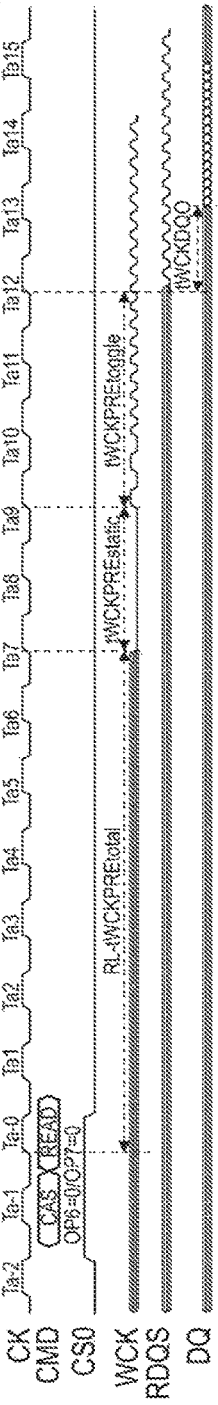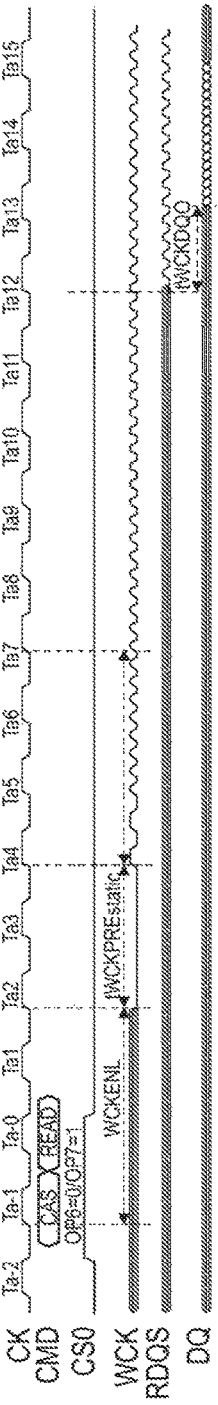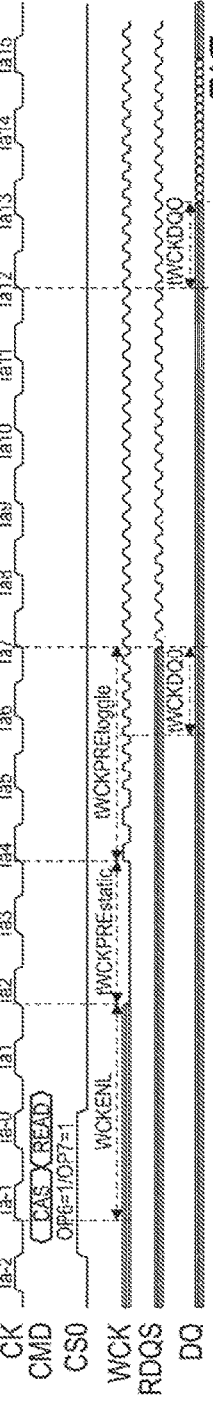
FIG. 6A
FIG. 6B
FIG. 6C
FIG. 6D

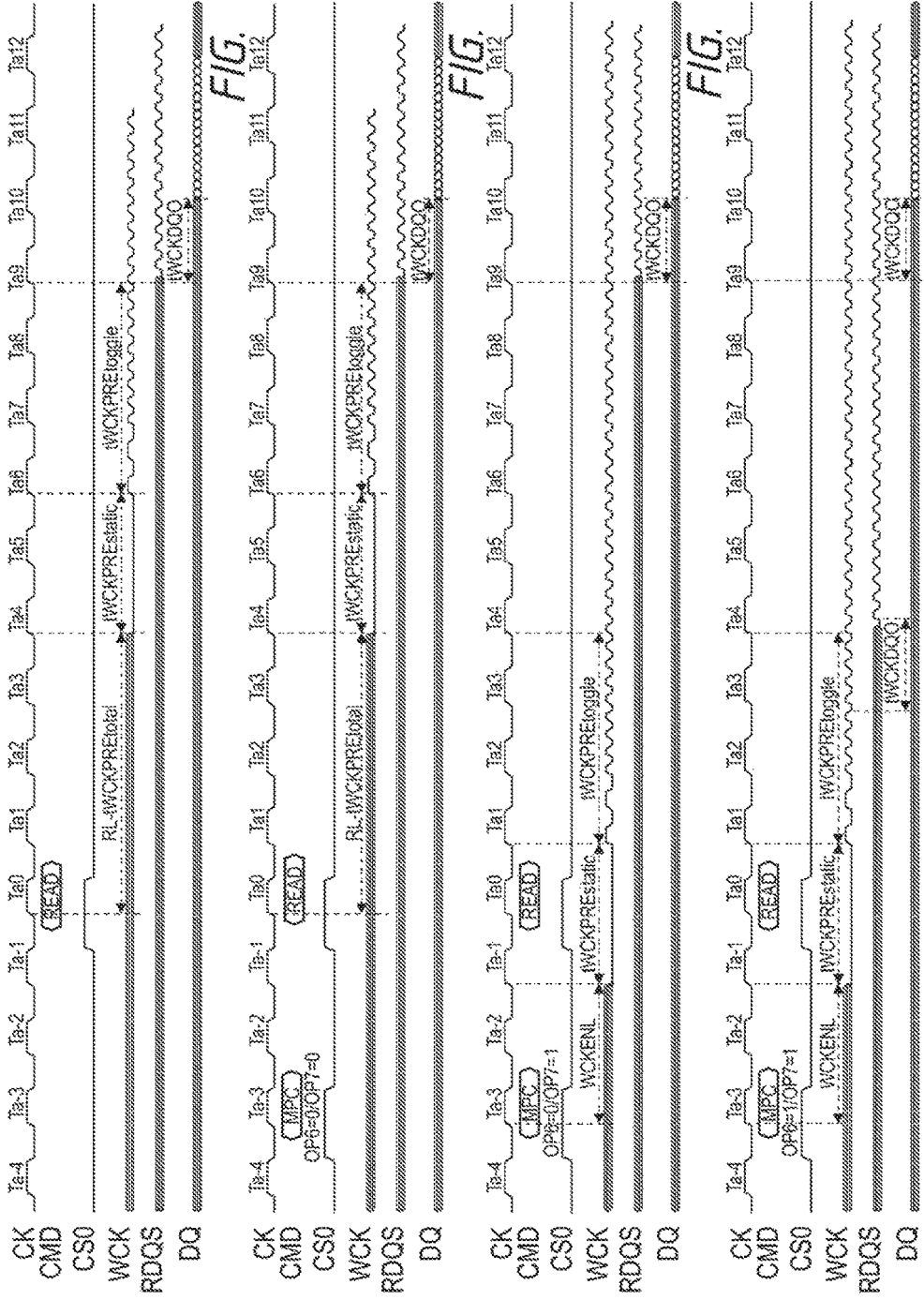

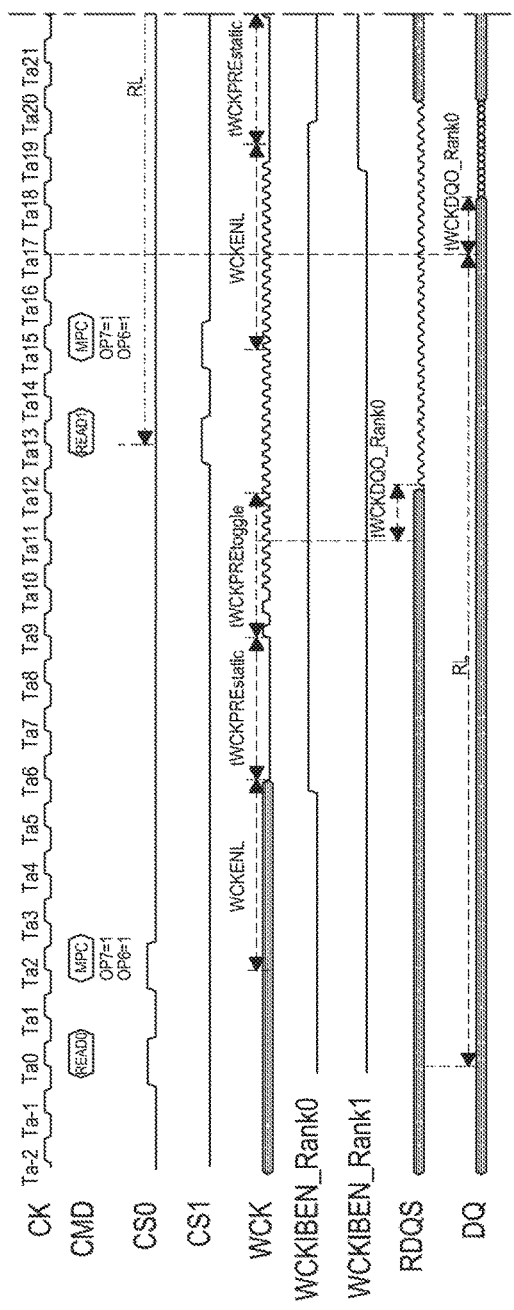
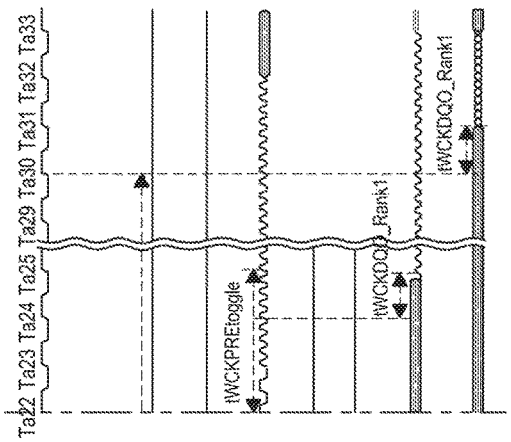
FIG. 11B-1
FIG. 11B-2

APPARATUSES AND METHODS INCLUDING MEMORY COMMANDS FOR SEMICONDUCTOR MEMORIES

BACKGROUND

Semiconductor memories are used in many electronic systems to store data that may be retrieved at a later time. As the demand has increased for electronic systems to be faster, have greater computing ability, and consume less power, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, address signals, clock signals. The various signals may be provided by a memory controller, for example. The command signals may control the semiconductor memories to perform various memory operations, for example, a read operation to retrieve data from a memory, and a write operation to store data to the memory. The data may be provided between the controller and memories with known timing relative to receipt of an associated command by the memory. The known timing is typically defined by latency information. The latency information may be defined by numbers of clock cycles of system clock signals CK and CKF.

With newly developed memories, the memories may be provided with system clock signals that are used for timing command signals and address signals, for example, and further provided with data clock signals that are used for timing read data provided by the memory and for timing write data provided to the memory. The memories may also provide clock signals to the controller for timing the provision of data provided to the controller.

The timing of various memory commands provided by the controller and received by the memories may be used to control performance of the memories, including the timing of when clock signals are provided, when data is provided, etc. Limitations on the timing of the various memory commands relative to one another may result in less desirable performance by the memories. As such, it may be desirable to have memory commands with flexible timing to provide desirable memory performance.

BRIEF DESCRIPTION OF THE DRAWINGS

FIGS. 6A-6D are timing diagrams for various signals during access operations according to an embodiment of the disclosure.

FIGS. 7A-7D are timing diagrams for various signals during access operations according to an embodiment of the disclosure.

FIGS. 10A-1 and 10A-2, 10B, and 10C are timing diagrams showing various signals during access operations for two ranks of memory according to various embodiments of the disclosure.

FIGS. 11A-1 and 11A-2 and 11B-1 and 11B-2 are timing diagrams showing various signals during access operations for two ranks of memory according to various embodiments of the disclosure.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Figure 1:
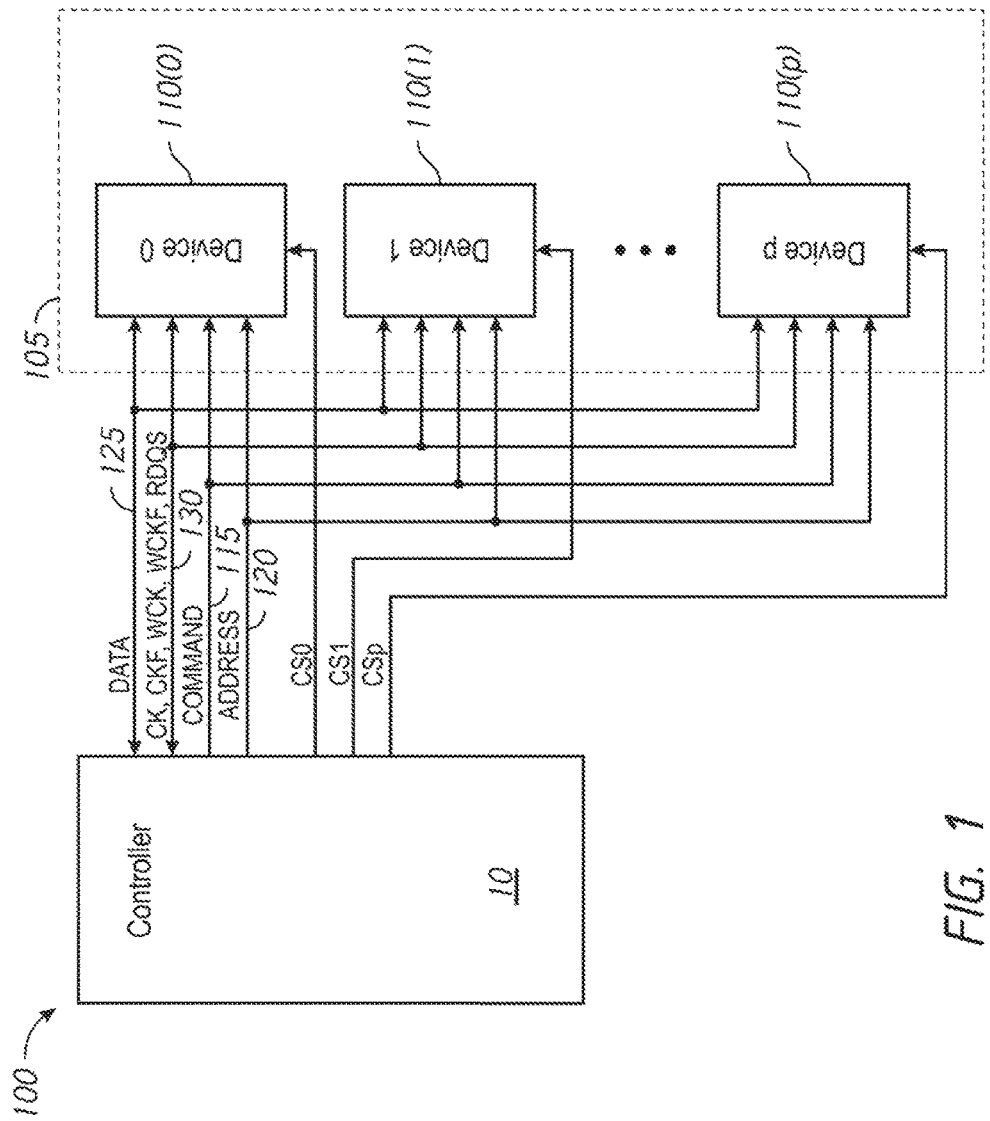
FIG. 1 is a block diagram of a system according to an embodiment of the disclosure.

FIG. 1 is a block diagram of a system 100 according to an embodiment of the disclosure. The system 100 includes a controller 10 and a memory system 105. The memory system 105 includes memories 110(0)-110(p) (e.g., "Device0" through "Devicep"), where p is a non-zero whole number. The memories 110(0)-110(p) are each coupled to the command, address, data, and clock busses. In some embodiments of the disclosure the memories 110(0)-110(p) are organized as ranks of memory. In such embodiments, the memories may be accessed by the ranks of memory. The controller 10 and the memory system 105 are in communication over several busses. For example, commands and addresses are received by the memory system 105 on a command bus 115 and an address bus 120, respectively, and data is provided between the controller 10 and the memory system 105 over a data bus 125. Various clock signals may be provided between the controller and memory system 105 over a clock bus 130. The clock bus 130 may include signal lines for providing system clock signals CK and CKF received by the memory system 105, data clock signals WCK, and WCKF received by the memory system 105 and an access data clock signal RDQS provided by the memory system 105 to the controller 10. Each of the busses may include one or more signal lines on which signals are provided.

The CK and CKF signals provided by the controller 10 to the memory system 105 are used for timing the provision and receipt of the commands and addresses. The WCK and WCKF signals and the RDQS signal are used for timing the provision of data. The CK and CKF signals are complementary and the WCK and WCKF signals are complementary. Clock signals are complementary when a rising edge of a first clock signal occurs at the same time as a falling edge of a second clock signal, and when a rising edge of the second clock signal occurs at the same time as a falling edge of the first clock signal. The WCK and WCKF signals provided by the controller 10 to the memory system 105 may be synchronized to the CK and CKF signals also provided by the controller 10 to the memory system 105. Additionally, the WCK and WCKF clock signals may have a higher clock frequency than the CK and CKF signals. For example, in some embodiments of the disclosure, the WCK and WCKF signals have a clock frequency that is four times the clock frequency of the CK and CKF signals. The WCK and WCKF signals may be provided by the controller 10 to the memory system 105 continuously during access operations (e.g., WCK always on option enabled) to improve timing performance for the access operations. However, continuously providing the WCK and WCKF signals increases power consumption by the system. Where power consumption may be of concern, the controller 10 does not provide the WCK and WCKF signals continuously (e.g., WCK always on option disabled).

The controller 10 provides commands to the memory system 105 to perform memory operations. Non-limiting examples of memory commands include timing commands for controlling the timing of various operations, access commands for accessing the memory, such as read commands for performing read operations and write commands for performing write operations, mode register write and read commands for performing mode register write and read operations, as well as other commands and operations. The command signals provided by the controller 10 to the memory system 105 further include select signals (e.g., chip select CS signals CS0, CS1, CSp). While all of the memories 110 are provided the commands, addresses, data, and clock signals, the select signals provided on respective select signal lines are used to select which of the memories 110 will respond to the command and perform the corresponding operation. In some embodiments of the disclosure, a respective select signal is provided to each memory 110 of the memory system 105. The controller 10 provides an active select signal to select the corresponding memory 110. While the respective select signal is active, the corresponding memory 100 is selected to receive to the commands and addresses provided on the command and address busses 115 and 120.

In operation, when a read command and associated address are provided by the controller 10 to the memory system 105, the memory 110 selected by the select signals receives the read command and associated addresses, and performs a read operation to provide the controller 10 with read data from a memory location corresponding to the corresponding addresses. The read data is provided by the selected memory 110 to the controller 10 according to a timing relative to receipt of the read command. For example, the timing may be based on a read latency (RL) value that indicates the number of clock cycles of the CK and CKF signals (a clock cycle of the CK and CKF signals referenced as tCK) after the read command when the read data is provided by the selected memory 110 to the controller 10. The RL value is programmed by the controller 10 in the memories 110. For example, the RL value may be programmed in respective mode registers of the memories 110. As known, mode registers included in each of the memories 110 may be programmed with information for setting various operating modes and/or select features for operation of the memories. One of the settings may be for the RL value.

In preparation of the selected memory 110 providing the read data to the controller 10, the controller provides active WCK and WCKF signals to the memory system 105. The WCK and WCKF signals may be used by the selected memory 110 to generate an access data clock signal RDQS. A clock signal is active when the clock signal transitions between low and high clock levels periodically. Conversely, a clock signal is inactive when the clock signal maintains a constant clock level and does not transition periodically. The RDQS signal is provided by the memory 110 performing the read operation to the controller 10 for timing the provision of read data to the controller 10.

The controller 10 may use the RDQS signal for receiving the read data. In some embodiments of the disclosure, the controller 10 has two modes for using the RDQS signal for receiving the read data. In a first mode, the controller 10 may use the RDQS signal to control the timing of circuitry for capturing the read data from the selected memory 110. In a second mode, the controller 10 may recover a clock timing from the RDQS signal and generate an internal timing signal based on the recovered timing. The internal timing signal may then be used by the controller 10 to control the timing of circuitry for capturing the read data from the selected memory 110.

The controller 10 provides information to the memory system 105 (e.g., in a command) to indicate in which of the modes the RDQS signal will be used by the controller 10. The memory system 105 provides the RDQS signal to the controller 10 with different timing depending on the mode indicated by the controller 10. For example, as will be described in more detail below, the RDQS signal may be provided to the controller 10 with a first timing for the first mode, and provided to the controller 10 with a second timing for the second mode, where the second timing is relatively earlier (e.g., sooner) in comparison to the first mode. The earlier timing of the memory system 105 providing the RDQS signal to the controller 10 may allow greater time for the controller 10 to recover the clock timing from the RDQS signal before the data is provided by the memory system 105 in order to meet the data timing as established by the read latency value RL.

In operation, when a write command and associated address are provided by the controller 10 to the memory system 105, the memory 110 selected by the select signals receives the write command and associated addresses, and performs a write operation to write data from the controller 10 to a memory location corresponding to the corresponding addresses. The write data is provided to the selected memory 110 by the controller 10 according to a timing relative to receipt of the write command. For example, the timing may be based on a write latency (WL) value that indicates the number of clock cycles of the CK and CKF signals after the write command when the write data is provided to the selected memory 110 by the controller 10. The WL value is programmed by the controller 10 in the memories 110. For example, the WL value may be programmed in respective mode registers of the memories 110.

In preparation of the selected memory 110 receiving the write data from the controller 10, the controller provides active WCK and WCKF signals to the memory system 105. The WCK and WCKF signals may be used by the selected memory 110 to generate internal clock signals for timing the operation of circuits to receive the write data. The data is provided by the controller 10 and the selected memory 110 receives the write data, which is written to memory corresponding to the memory addresses.

Figure 2:
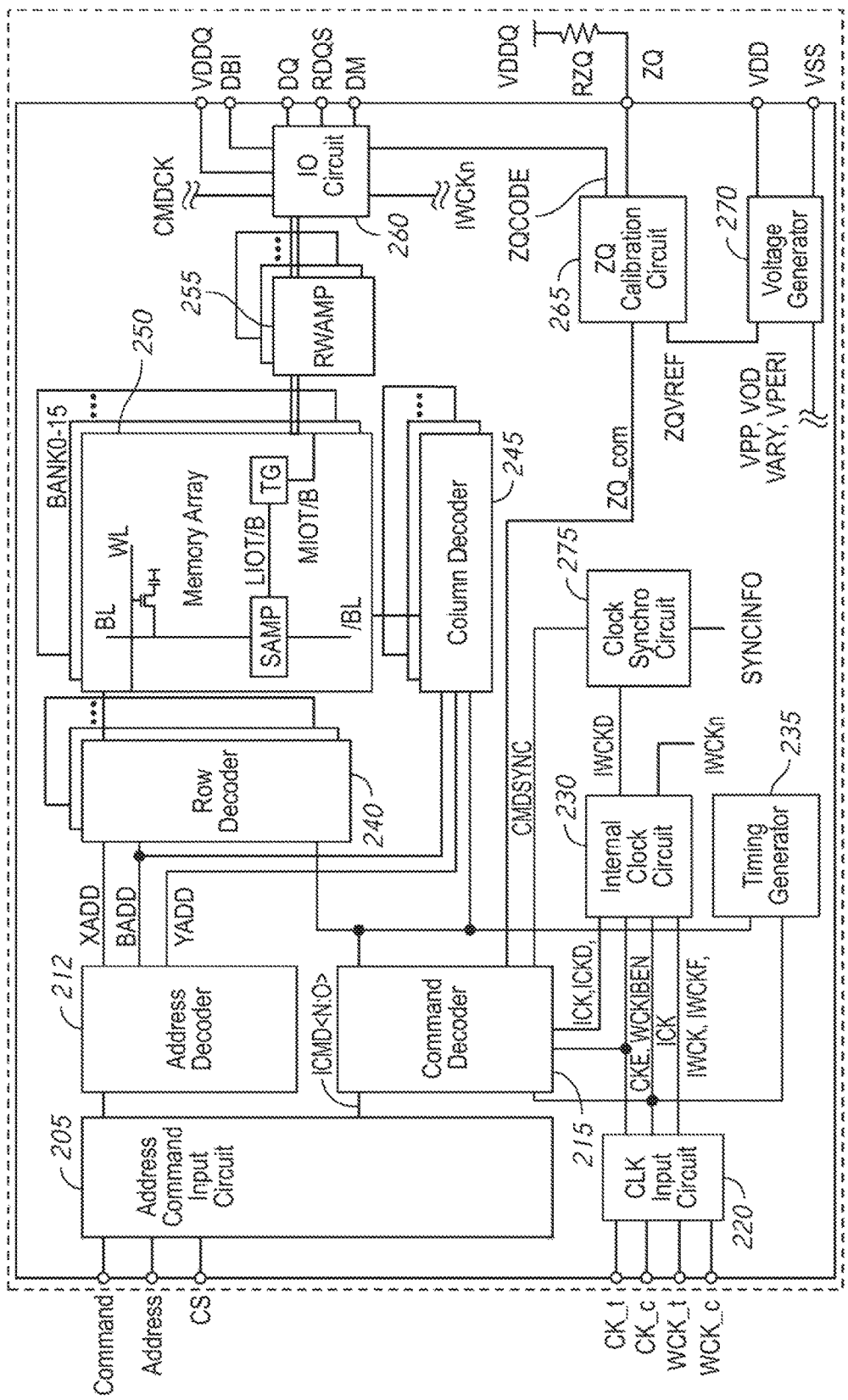
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred as such. In some embodiments, the semiconductor device 200 may include, without limitation, a DRAM device, such as low power DDR (LPDDR) memory integrated into a single semiconductor chip, for example. The semiconductor device 200 may be included in the memory system 205 of FIG. 2 in some embodiments of the disclosure. For example, each of the memories 210 may include a semiconductor device 200. The semiconductor device 200 includes a memory die. The die may be mounted on an external substrate, for example, a memory module substrate, a mother board or the like. The semiconductor device 200 may further include a memory array 250. The memory array 250 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 240 and the selection of the bit line BL is performed by a column decoder 245. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 200 may employ a plurality of external terminals that include command and address terminals coupled to a command bus and an address bus to receive command signals COMMAND and address signals ADDRESS, respectively, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and the ZQ calibration terminal (ZQ).

The command terminals and address terminals may be supplied with an address signal and a bank address signal from outside. The address signal and the bank address signal supplied to the address terminals are transferred, via a command/address input circuit 205, to an address decoder 212. The address decoder 212 receives the address signals and supplies a decoded row address signal to the row decoder 240, and a decoded column address signal to the column decoder 245. The address decoder 212 also receives the bank address signal and supplies the bank address signal to the row decoder 240, the column decoder 245.

The command and address terminals may further be supplied with command signals COMMAND from, for example, a memory controller. The command signals COMMAND may be provided as internal command signals ICMD to a command decoder 215 via the command/address input circuit 205. The command decoder 215 includes circuits to decode the internal command signals ICMD to generate various internal signals and commands for performing operations, for example, a row command signal to select a word line and a column command signal to select a bit line. Another example may be providing internal signals to enable circuits for performing operations, such as control signals to enable signal input buffers that receive clock signals. The internal commands also include output and input activation commands, such as a sync command CMDSYNC.

When a read command is issued and a row address and a column address are timely supplied with the read command, read data is read from a memory cell in the memory array 250 designated by these row address and column address. The read command is received by the command decoder 215, which provides internal commands to input/output circuit 260 so that read data is output to outside from the data terminals DQ, RDQS, DBI, and DMI via read/write amplifiers 255 and the input/output circuit 260 according to the RDQS clock signals. The read data is provided at a time defined by read latency information RL that may be programmed in the semiconductor device, for example, in a mode register (not shown in FIG. 2). The read latency information RL may be defined in terms of clock cycles of the CK clock signal. For example, the read latency information RL may be a number of clock cycles of the CK signal after the read command is received by the semiconductor device 200 when the associated read data is provided.

When the write command is issued and a row address and a column address are timely supplied with this command, then write data is supplied to the data terminals DQ, DBI, and DMI according to the WCK and WCKF clock signals. The write command is received by the command decoder 215, which provides internal commands to the input/output circuit 260 so that the write data is received by data receivers in the input/output circuit 260, and supplied via the input/output circuit 260 and the read/write amplifiers 255 to the memory array 250. The write data is written in the memory cell designated by the row address and the column address. The write data is provided to the data terminals at a time that is defined by write latency WL information. The write latency WL information may be programmed in the semiconductor device 200, for example, in the mode register (not shown in FIG. 2). The write latency WL information may be defined in terms of clock cycles of the CK clock signal. For example, the write latency information WL may be a number of clock cycles of the CK signal after the write command is received by the semiconductor device 200 when the associated write data is provided.

Turning to the explanation of the external terminals included in the semiconductor device 200, the clock terminals and data clock terminals are supplied with external clock signals and complementary external clock signals. The external clock signals CK, CKF, WCK, WCKF may be supplied to a clock input circuit 220. When enabled, input buffers included in the clock input circuit 220 receive the external clock signals. For example, an input buffer receives the CK and CKF signals when enabled by a CKE signal from the command decoder 215 and an input buffer receives the WCK and WCKF signals when enabled by a WCKIBEN signal from the command decoder 215. The clock input circuit 220 may receive the external clock signals to generate internal clock signals ICK and IWCK and IWCKF. The internal clock signals ICK and IWCK and IWCKF are supplied to internal clock circuits 230.

The internal clock circuits 230 includes circuits that provide various phase and frequency controlled internal clock signals based on the received internal clock signals. For example, the internal clock circuits 230 may include a clock path (not shown in FIG. 2) that receives the ICK clock signal and provides internal clock signals ICK and ICKD to the command decoder 215. The internal clock circuits 230 may further include a data clock path that receives the IWCK and IWCKF clock signals and provides multiphase clock signals IWCKn based on the internal clock signals IWCK and IWCKF. As will be described in more detail below, the multiphase clock signals IWCKn have relative phases with each other and have a phase relationship with the WCK and WCKF clock signals. The multiphase clock signals IWCKn may also be provided to the input/output circuit 260 for controlling an output timing of read data and the input timing of write data. The input/output circuit 160 may include clock circuits and driver circuits for generating and providing the RDQS signal. The data clock path may also provide a delayed multiphase clock signal IWCKD, which is one of the multiphase clock signals IWCKn further delayed.

A clock synchronization circuit 275 is provided with the delayed multiphase clock signal IWCKD and the sync command CMDSYNC. The clock synchronization circuit 275 provides an output signal SYNCINFO having a logic level that is indicative of a phase relationship between the multiphase clock signals IWCKn and the WCK and WCKF clock signals.

The power supply terminals are supplied with power supply potentials VDD and VSS. These power supply potentials VDD and VSS are supplied to an internal voltage generator circuit 270. The internal voltage generator circuit 270 generates various internal potentials VPP, VOD, VARY, VPERI, and the like and a reference potential ZQVREF based on the power supply potentials VDD and VSS. The internal potential VPP is mainly used in the row decoder 240, the internal potentials VOD and VARY are mainly used in the sense amplifiers included in the memory array 250, and the internal potential VPERI is used in many other circuit blocks. The reference potential ZQVREF is used in the ZQ calibration circuit 265.

The power supply terminal is also supplied with power supply potential VDDQ. The power supply potentials VDDQ is supplied to the input/output circuit 260 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 260 so that power supply noise generated by the input/output circuit 260 does not propagate to the other circuit blocks.

The calibration terminal ZQ is connected to the ZQ calibration circuit 265. The ZQ calibration circuit 265 performs a calibration operation with reference to an impedance of RZQ, and the reference potential ZQVREF, when activated by the ZQ calibration command ZQ_com. An impedance code ZQCODE obtained by the calibration operation is supplied to the input/output circuit 260, and thus an impedance of an output buffer (not shown) included in the input/output circuit 260 is specified.

Figure 3:
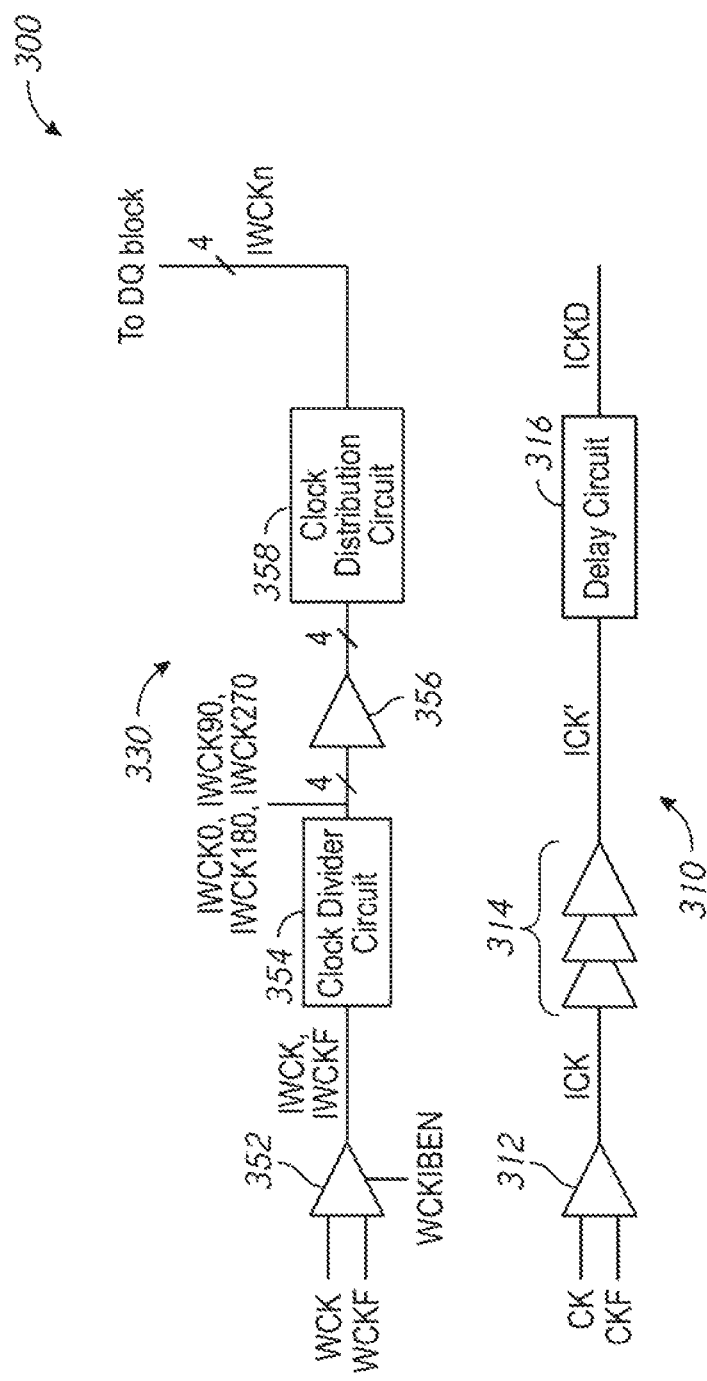
FIG. 3 is a block diagram of a clock path and a data clock path according to an embodiment of the disclosure.

FIG. 3 is a block diagram of a clock path 310 and a data clock path 330 according to an embodiment of the disclosure. The clock path 310 and data clock path 330 may be included in the semiconductor device 300 of FIG. 3 in some embodiments of the disclosure. For example the data clock path 330 may be included in the clock input circuit 220 and the internal clock circuit 230 of the semiconductor device 200 of FIG. 2. One or both of the clock path 310 and the data clock path 330 may be modified without departing from the scope of the present disclosure.

The clock path 310 may include an input buffer 312 that receives complementary clock signals CK and CKF and provides an internal clock signal ICK. The input buffer 312 may be included in the clock input circuit 220 of FIG. 2. The internal clock signal ICK is based on the CK and CKF clock signals. Repeater circuits 314 receive the ICK clock signal and provide an ICK' clock signal to a delay circuit 316. The repeater circuits 314 drive the ICK' clock signal over a clock line from the input buffer 312 to the delay circuit 316. The ICK' clock signal is delayed by the delay circuit 316 to provide a delayed ICK clock signal ICKD. The ICK' and ICKD signals may be used by a command path (not shown) for timing the decoding and provision of internal command signals to perform memory operations (e.g., read, write, etc.).

The data clock path 330 includes an input buffer 352. When enabled by an active enable signal WCKIBEN (e.g., active high logic level), the input buffer 352 receives complementary clock signals WCK and WCKF and provides the complementary internal clock signals IWCK and IWCKF based on the WCK and WCKF clock signals. The receiver circuit 352 may be enabled, for example, by a command decoder responsive to a memory command. In an embodiment of the disclosure, the IWCK and IWCK clock signals have a same clock frequency as a clock frequency of the WCK and WCKF clock signals, and the IWCK clock signal corresponds to the WCK clock signal and the IWCKF clock signal corresponds to the WCKF clock signal. The input buffer 352 may be included in the clock input circuit 220 of FIG. 2.

The IWCK and IWCKF clock signals are provided to a clock divider circuit 354 that is configured to provide multiphase clock signals IWCK0, IWCK90, IWCK180, IWCK270 (collectively referred to as the multiphase clock signals IWCKn). The multiphase clock signals have relative phases to one another, and have a clock frequency that is less than a clock frequency of the WCK and WCKF clock signals (and the IWCK and IWCKF signals). In an embodiment of the disclosure, the IWCK0, IWCK90, IWCK180, and IWCK270 clock signals have a clock frequency that is one-half the clock frequency of the WCK and WCKF clock signals.

In an embodiment of the disclosure, the IWCK0, IWCK90, IWCK180, and IWCK270 clock signals have a relative phase of 90 degrees to one another. For example, the IWCK90 clock signal has a phase of 90 degrees relative to the IWCK0 clock signal, the IWCK180 clock signal has a phase of 180 degrees relative to the IWCK0 clock signal (and a phase of 90 degrees relative to the IWCK90 clock signal), and the IWCK270 clock signal has a phase of 270 degrees relative to the IWCK0 clock signal (and a phase of 90 degrees relative to the IWCK180 clock signal). In such a case, the multiphase clock signals IWCK0, IWCK90, IWCK180, IWCK270 may be referred to as "quadrature" phase clock signals.

The multiphase clock signals are provided to repeater circuits 356. The repeater circuits 356 include a repeater circuit for each of the multiphase clock signals IWCKn. The repeater circuits 356 drive the multiphase clock signals IWCKn over clock lines from the clock divider circuit 354 to a clock distribution circuit 358. The clock distribution circuit 358 provides the multiphase clock signals IWCKn to various circuitries that operate according to the multiphase clock signals. For example, the multiphase clock signals IWCKn may be provided to clock input/output circuits (not shown in FIG. 3) to provide and receive data (referenced in FIG. 3 as "To DQ block").

As previously described, the IWCK0, IWCK90, IWCK180, IWCK270 signals provided by the clock divider circuit 354 are based on the IWCK and IWCKF signals. The IWCK0, IWCK90, IWCK180, IWCK270 signals may have a phase relationship relative to the IWCK and IWCKF signals, and likewise, with the WCK and WCKF signals (from which the IWCK and IWCKF signals are based). For example, the multiphase clock signals IWCK0, IWCK90, IWCK180, and IWCK270 provided by the clock divider circuit 354 may have one of two phase relationships relative to the WCK and WCKF clock signals. A first phase relationship and a second phase relationship are illustrated in FIG. 4.

In the first phase relationship, a rising edge 420 of the IWCK0 clock signal is associated with a first rising edge 410 of the IWCK clock signal (and the WCK signal, not shown in FIG. 4) and a first rising edge of the CK signal, a rising edge 422 of the IWCK90 clock signal is associated with a first falling edge 412 of the IWCK clock signal, a rising edge 424 of the IWCK180 clock signal is associated with a second rising edge 414 of the IWCK clock signal and a first falling edge of the CK signal, and a rising edge 426 of the IWCK270 clock signal is associated with a second falling edge 416 of the IWCK clock signal. The first phase relationship may be referred to as an "in order" phase relationship.

In the second phase relationship, a falling edge 430 of the IWCK0 clock signal is associated with the first rising edge 410 of the IWCK clock signal (and the WCK signal) and a first rising edge of the CK signal, a falling edge 432 of the IWCK90 clock signal is associated with the first falling edge 412 of the IWCK clock signal, a falling edge 434 of the IWCK180 clock signal is associated with the second rising edge 414 of the IWCK clock signal and a first falling edge of the CK signal, and a falling edge 436 of the IWCK270 clock signal is associated with the second falling edge 416 of the IWCK clock signal. The second phase relationship may be referred to as an "out of order" phase relationship.

Figure 4:
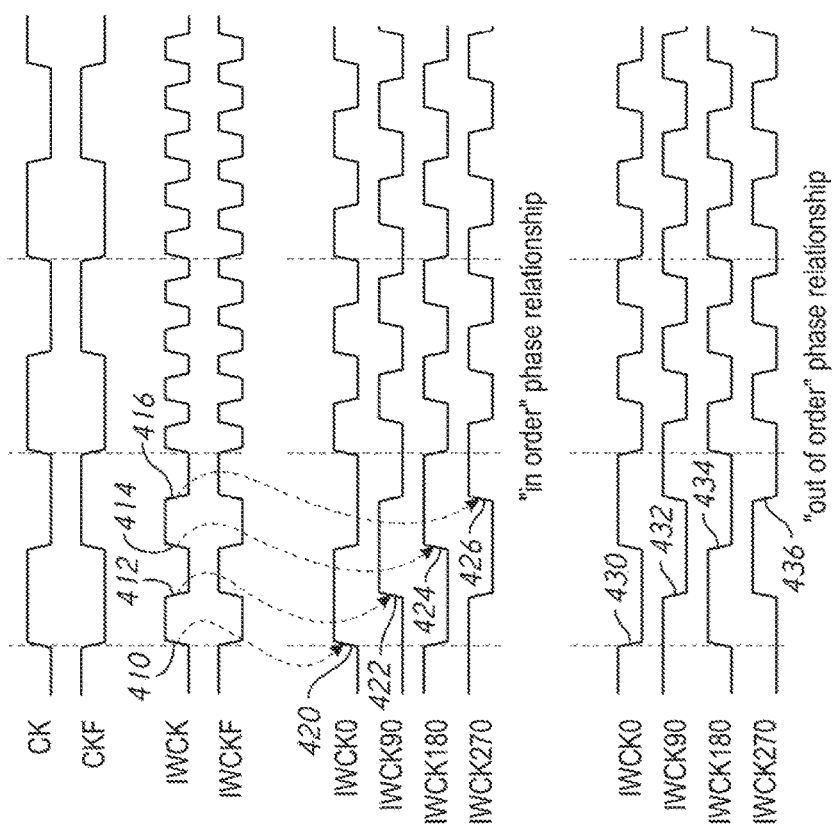
FIG. 4 is a timing diagram showing a first phase relationship and a second phase relationship between clock signals according to an embodiment of the disclosure.

The first and second phase relationships are maintained even when a clock frequency of the WCK and WCKF (and IWCK and IWCKF) clock signals changes, for example, the clock frequency increases, as shown in FIG. 4 following the falling edge 416 of the IWCK clock signal.

The phase relationship of the multiphase clock signals IWCKn provided by the clock divider circuit 254 may not be known until a determination is made. The phase relationship of the multiphase clock signals IWCKn may be determined, for example, by evaluating at least one of the multiphase clock signals. The phase relationship may be determined during a WCK-CK synchronization process, which is described in more detail below.

Determining the phase relationship of the multiphase clock signals IWCKn to the WCK and WCKF signals may be needed because proper operation of the semiconductor device 100 may be based on the multiphase clock signals having one of the phase relationships. For example, read data may be provided by the semiconductor device 100 properly when the multiphase clock signals have the "in order" phase relationship. In such an example, when it is determined that the multiphase clock signals IWCKn have the "out of order" phase relationship, various ones of the multiphase clock signals may be switched to provide "in order" multiphase clock signals. As an example, the IWCK180 clock signal and the IWCK0 clock signal of the out of order multiphase clock signals may be switched and the IWCK270 clock signal and the IWCK90 clock signal of the out of order multiphase clock signals may be switched. As a result, the "out of order" multiphase clock signals are switched into "in order" multiphase clock signals.

Figure 5:
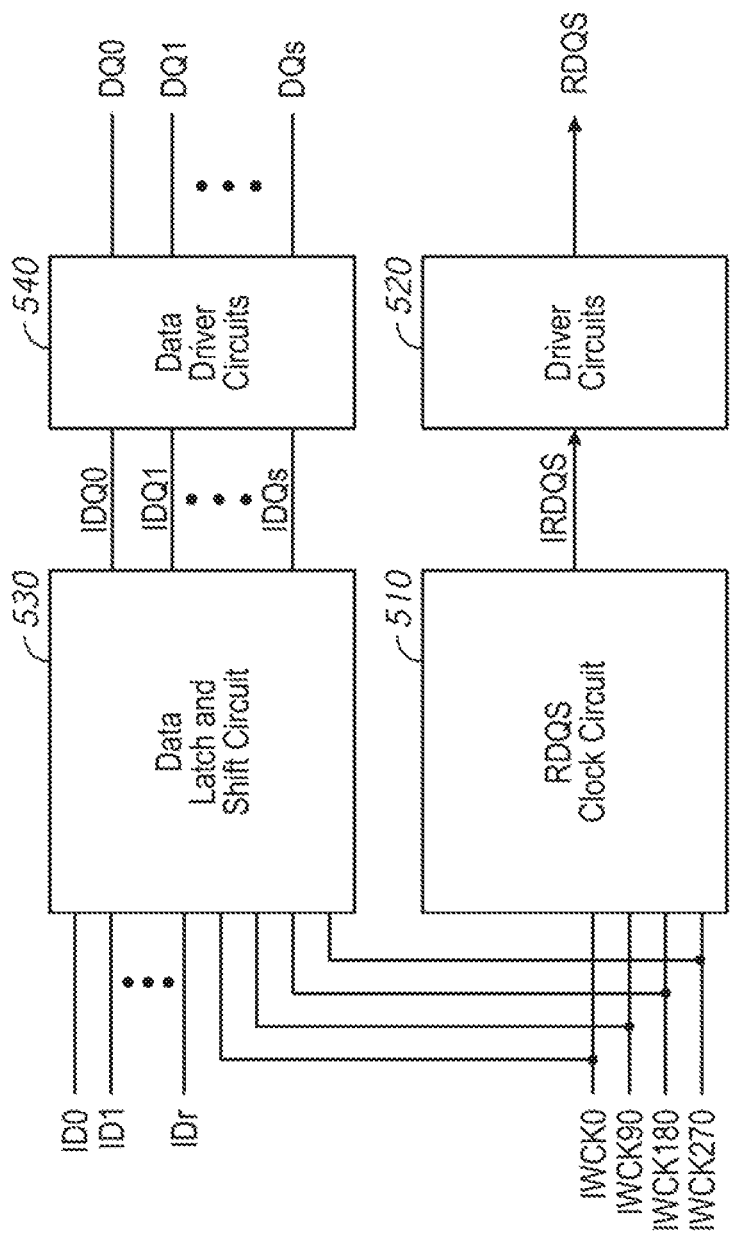
FIG. 5 is a block diagram of a portion of an IO circuit according to an embodiment of the disclosure.

FIG. 5 is a block diagram of a portion of an IO circuit according to an embodiment of the disclosure. A RDQS clock circuit 510 and a data latch and shift circuit 530 receive multiphase clock signals IWCK0, IWCK90, IWCK180, and IWCK270 (collectively IWCKn signals). The IWCKn signals may be quadrature clock signals, each clock signal having a 90 degree phase relative to another one of the clock signals (e.g., 0 degree clock signal, 90 degree clock signal, 180 degree clock signal, and 270 degree clock signal). The IWCKn signals may be based on data clock signals WCK and WCKF, and have a clock frequency that is lower than a clock frequency of the WCK and WCKF signals. In some embodiments of the disclosure, the IWCKn signals have half the clock frequency of the WCK and WCKF signals. The multiphase clock signals IWCKn may be provided by a data clock path that receives the WCK signal. For example, in some embodiments of the disclosure, the IWCKn signals may be provided by the data clock path 330 shown in FIG. 3.

The RDQS clock circuit 510 provides an internal strobe signal IRDQS based on the IWCKn signals. The IRDQS signal is provided to the driver circuit 520. The driver circuit 520 provides a data strobe signal RDQS based on the IRDQS signal. The RDQS signal may be provided to a device (e.g., a controller 10) for timing the receipt of data by the device. The clock frequency of the RDQS signal may be greater than the clock frequency of the IWCKn signals. In some embodiments of the disclosure, the RDQS signal has a clock frequency that is twice the clock frequency of the IWCKn signals. Where the clock frequency of the IWCKn signals is one-half the clock frequency of the WCK and WCKF signals, the RDQS signal may have the same clock frequency as the WCK and WCKF signals.

In addition to the IWCKn signals, the data latch and shift circuit 530 receives internal data ID0-IDr, where r is a non-zero whole number. The ID0-IDr data may be provided from a memory array. For example, in some embodiments of the disclosure, the ID data is provided from the memory array 250 to an input/output circuit 260 including the data latch and shift circuit 530. The data latch and shift circuit 530 latches and shifts the internal data ID0-IDr based on the IWCKn signals to provide data IDQ0-IDQs where s is a non-zero whole number. The IDQ0-IDQs data is provided to data driver circuits 540 that drive the IDQ0-IDQs data as DQ0-DQs data. The data driver circuits 540 may include (s+1) data driver circuits, in particular, one data driver circuit for each of the IDQ0-IDQs data.

In operation, the data latch and shift circuit 530 shifts (r+1) bits wide ID0-IDr data into (s+1) bits wide IDQ0-IDQs data based on the IWCKn signals. The IDQ0-IDQs data is then provided by the data driver circuits 540 as (s+1) bits wide DQ0-DQs data. The DQ0-DQs data may be provided with a timing that corresponds with the RDQS signal. For example, one bit for each of the DQ0-DQs data may be provided at rising and falling clock edges of the RDQS signal. As a result, at each edge of the RDQS signal (s+1) bits are output in parallel. In this manner, receipt of (s+1) bits of the DQ0-DQs data, for example, by a device, may be timed according to RDQS signal.

As will be described in more detail below, a controller provides a memory system memory commands to access memory (e.g., read or write memory). The memory commands provided for accessing memory include timing command and access commands. As previously described, timing commands may be used to control the timing of various operations, for example, for a corresponding access command. Examples of access commands include a read command and a write command. Examples of timing commands include a CAS command and a MPC command. The timing commands may include opcodes that set various modes of operation during an access operation for an access command. For example, bits of information associated with various opcodes are included in the timing command. An opcode may include one or more bits of the timing command. The opcodes may be identified by a bit position of the timing command. For example, as will be described in more detail below, opcode OP6 of the timing commands may be associated with a RDQS early mode and opcode OP7 may be associated with a WCK-CK fast synchronization mode.

The respective mode may be enabled by providing a "I" and disabled by providing a "0" for the associated bit included in the timing command.

FIGS. 6-11 are examples of various access operations according to embodiments of the disclosure. The embodiments illustrate the use of timing commands (e.g., CAS command and MPC command) with an access command (e.g., read command). While the embodiments of FIGS. 6-11 are described in the context of read operations, it will be appreciated that the timing commands may be used in the context of write operations without departing from the scope of the disclosure.

FIGS. 6A-6D are timing diagrams for various signals during access operations according to an embodiment of the disclosure. FIGS. 6A-6D will be described with reference to read operations for a system including a controller and a memory system. In some embodiments of the disclosure, the system 100 of FIG. 1 may be used for the operation described with reference to FIGS. 6A-6D. FIGS. 6A-6D will be described with reference to the system 100 of FIG. 1, but the scope of the disclosure is not limited to the particular system 100. The read latency for the read operation of FIGS. 6A-6D is 12 tCK (e.g., 12 clock cycles of the CK signal).

With reference to FIG. 6A, at time Ta0, a select signal CS0 provided by the controller 10 is active to select a memory 110 of the memory system 105 that is associated with the CS0 signal (e.g., "Device0" of the memory system 105). As a result, Device0 receives a read command READ responsive to a rising clock edge of the CK signal at time Ta0. A command/address input circuit of Device0 receives the READ command and provides it to a command decoder to generate internal control signals to perform a read operation. For example, the command decoder may generate internal control signals to enable a WCK/WCKF input buffer of the Device0 in preparation for receiving the WCK and WCKF signals from the controller 10. The WCKF signal is not shown in FIGS. 6A-6D. As previously described, the WCKF signal is complementary to the WCK signal. For the sake of simplicity, the WCK and WCKF signals may be referred to collectively as the WCK signal where applicable for the description of FIGS. 6A-6D. The WCK signal remains static between times Ta7 and Ta9 (e.g., static period tWCKPREstatic). That is, the WCK signal remains at a known clock level (e.g., at a low clock level) for the time period between times Ta7 and Ta9. At time Ta9, an active WCK signal provided by the controller 10 is received by the Device0. The WCK signal may have a first clock frequency followed by a second higher clock frequency (at time Ta10), as illustrated in the embodiment of FIG. 6A.

Between times Ta9 when the active WCK signal is received by the Device0 and Ta12 when the Device0 provides an active access data clock signal RDQS (e.g., time period tWCKPREtoggle), the Device0 performs WCK-CK synchronization and begins generating internal clock signals based on the WCK signal. For example, internal clock circuits (e.g., a clock divider circuit) may generate multiphase clock signals used for timing internal operations and determine a phase relationship with the WCK signal. The internal clock signals may be used to provide the RDQS signal, such as by a RDQS clock circuit that uses multiphase clock signals based on the WCK signal to generate the RDQS signal. At time Ta12, the Device0 provides the active RDQS signal to the controller 10. Also at time Ta12, or within a time period tWCKDQO, data DQ is provided from the Device0 by an input/output circuit. The data DQ is provided having a timing synchronized with the RDQS signal. For example, as shown in the embodiment of FIG. 6A, a bit of data DQ is provided for each clock edge of the RDQS signal until a data burst is complete (e.g., a 16-bit data burst is shown in FIG. 6A). FIG. 6A shows the data DQ provided from one data terminal of the Device0. While not shown in FIG. 6A, data may concurrently be provided from other data terminals of the Device0 having the same relative timing.

With reference to FIG. 6B, at time Ta-1, a select signal CS0 provided by the controller 10 is active to select the Device0. As a result, the command/address input circuit of Device0 receives a CAS command for a rising clock edge of the CK signal at time Ta-1 and receives a read command READ for a rising clock edge of the CK signal at time Ta0. The CAS command represents a timing command as previously described. The CAS command immediately precedes an access command (e.g., the READ command), with the CAS command and the associated access command provided as a sequential pair of commands. The CAS command includes opcode OP6=0 to disable a RDQS early mode and OP7=0 to disable a WCK-CK fast synchronization mode. The RDQS early mode and the WCK-CK fast synchronization mode are described in more detail below. The command decoder decodes the CAS and READ commands and generates the internal control signals accordingly. The operation of FIG. 6B proceeds similarly to the operation described with reference to FIG. 6A.

Following the READ command, the WCK/WCKF input buffer of the Device0 is enabled in preparation for receiving the WCK and WCKF signals from the controller 10. The WCK signal remains static for the static period tWCKPREstatic between times Ta7 and Ta9. At time Ta9, an active WCK signal provided by the controller 10 is received by the Device0, and the Device0 performs WCK-CK synchronization and generates internal clock signals based on the WCK signal that are used to provide the RDQS signal. At time Ta12, the Device0 provides the active RDQS signal to the controller, and provides data DQ within a time period tWCKDQO of time Ta12. As with FIG. 6A, the data DQ is provided from the input/output circuit of Device0 synchronized with the RDQS signal such that a bit of data DQ is provided for each clock edge of the RDQS signal until a data burst is complete. While FIG. 6B shows the data DQ provided from one data terminal of the Device0, data may concurrently be provided from other data terminals of the Device0 having the same relative timing concurrently.

With reference to FIG. 6C, at time Ta-1, a select signal CS0 provided by the controller 10 is active to select the Device0. As a result, Device0 receives a CAS command for a rising clock edge of the CK signal at time Ta-1 and receives a read command READ for a rising clock edge of the CK signal at time Ta0. The CAS command includes opcode OP6=0 to disable the RDQS early mode and OP7=1 to enable the WCK-CK fast synchronization mode. The command decoder decodes the CAS and READ commands and generates the internal control signals to enable the WCK-CK fast synchronization mode and perform the read operation.

The WCK signal may be provided earlier relative to the timing shown in FIGS. 6A and 6B when the WCK-CK fast synchronization mode is enabled. With the WCK-CK fast synchronization mode enabled, enablement of the WCK/WCKF input buffer of the Device0 in preparation for receiving the WCK and WCKF signals from the controller 10 begins at time Ta-1, that is, at the time the CAS command is received by the Device0. As shown in FIG. 6C, enablement of the WCK/WCKF input buffer occurs over a time period WCKENL between times Ta-1 and Ta2. Starting at time Ta2, the WCK signal remains static (at the low clock level) for the static period tWCKPREstatic between times Ta2 and Ta4. At time Ta4, an active WCK signal provided by the controller 10 is received by the Device0, and the Device0 performs WCK-CK synchronization and generates internal clock signals based on the WCK signal, which may be used to provide the RDQS signal.

In comparison to the WCK timing shown in FIGS. 6A and 6B where the WCK-CK fast synchronization mode is not enabled, the Device0 is ready to receive the WCK signal from the controller 10 earlier when the WCK-CK fast synchronization mode is enabled. For example, as shown in the example of FIG. 6C, the WCK signal is provided 5 tCKs earlier than for the examples of FIGS. 6A and 6B. The controller 10 may enable the WCK-CK fast synchronization mode in order to provide the WCK signal earlier to allow the Device0 to begin generating internal signals based on the WCK signal.

At time Ta12, the Device0 provides the active RDQS signal to the controller, and provides data DQ within a time period tWCKDQO of time Ta12. The data DQ is provided from the Device0 synchronized with the RDQS signal such that a bit of data DQ is provided for each clock edge of the RDQS signal until a data burst is complete. While FIG. 6C shows the data DQ provided from one data terminal of the Device0, data may also be provided from other data terminals of the Device0 having the same relative timing concurrently.

With reference to FIG. 6D, at time Ta-1, a select signal CS0 provided by the controller 10 is active to select the Device0. As a result, Device0 receives a CAS command for a rising clock edge of the CK signal at time Ta-1 and receives a read command READ for a rising clock edge of the CK signal at time Ta0. The CAS command includes opcode OP6=1 to enable RDQS early mode and OP7=1 to enable WCK-CK fast synchronization mode. The command decoder decodes the CAS and READ commands and generates the internal control signals to enable the WCK-CK fast synchronization mode and enable the RDQS early mode for the read operation.

The RDQS signal may be provided by the Device0 earlier relative to the timing shown in FIGS. 6A-6C when the RDQS early mode is enabled. Additionally, with the WCK-CK fast synchronization mode is enabled, the WCK signal may be provided sooner relative to the timing shown in FIGS. 6A and 6B. With the WCK-CK fast synchronization mode enabled, enablement of the WCK/WCKF input buffer of the Device0 in preparation for receiving the WCK and WCKF signals from the controller 10 begins at time Ta-1, which is the time the CAS command is received by the Device0. As shown in FIG. 6D, enablement of the WCK/WCKF input buffer occurs over a time period WCKENL between times Ta-1 and Ta2. Starting at time Ta2, the WCK signal remains static for the static period tWCKPREstatic between times Ta2 and Ta4. At time Ta4, an active WCK signal provided by the controller 10 is received by the Device0, and during the time period tWCKPREtoggle the Device0 performs WCK-CK synchronization and generates internal clock signals based on the WCK signal that are used to provide the RDQS signal.

At time Ta6, or within a time period tWCKDQO of time Ta6, the Device0 provides the active RDQS signal to the controller. In comparison to the RDQS signal timing shown in FIGS. 6A-6C where the RDQS early mode is not enabled, the RDQS signal is provided earlier when the RDQS early mode is enabled. For example, as shown in the example of FIG. 6D, the RDQS signal is provided 5 to 6 tCKs earlier than for the examples of FIGS. 6A-6C. The controller 10 may enable the RDQS early mode in order to receive the RDQS signal from Device0 and recover a timing from the RDQS signal and generate an internal timing signal based on the recovered timing. The internal timing signal generated by the controller 10 may be used to time the receipt of the data DQ from the Device0.

At time Ta12, the Device0 provides data DQ within a time period tWCKDQO of time Ta12. The data DQ is provided from the Device0 synchronized with the RDQS signal such that a bit of data DQ is provided for each clock edge of the RDQS signal until a data burst is complete. While FIG. 6D shows the data DQ provided from one data terminal of the Device0, data may also be provided from other data terminals of the Device0 having the same relative timing concurrently.

In FIGS. 6A-6D, the time period WCKENL is shown as 3 clock cycles of the WCK signal (3 tCK), the time period tWCKPREstatic is shown as 2 tCK, and the time period tWCKPREtoggle is shown as 3 tCK. Each of the time periods WCKENL, tWCKPREstatic, and tWCKPREtoggle may be the same or different in other embodiments of the disclosure.

FIGS. 7A-7D are timing diagrams for various signals during access operations according to an embodiment of the disclosure. FIGS. 7A-7D will be described with reference to read operations for a system including a controller and a memory system. In some embodiments of the disclosure, the system 100 of FIG. 1 may be used for the operation described with reference to FIGS. 7A-7D. FIGS. 7A-7D will be described with reference to the system 100 of FIG. 1, but the scope of the disclosure is not limited to the particular system 100. The read latency for the read operation of FIGS. 7A-7D is 9 tCK (e.g., 9 clock cycles of the CK signal).

With reference to FIG. 7A, at time Ta0, a select signal CS0 provided by the controller 10 is active to select a memory of the memory system 105 that is associated with the CS0 signal (e.g., "Device0" of the memory system 105). As a result, Device0 receives a read command READ responsive to a rising clock edge of the CK signal at time Ta0. A command/address input circuit of Device0 receives the READ command and provides it to a command decoder to generate internal control signals to perform a read operation. For example, the command decoder may generate internal control signals to enable a WCK/WCKF input buffer of the Device0 in preparation for receiving the WCK and WCKF signals from the controller 10. The WCKF signal is not shown in FIGS. 7A-7D. As previously described, the WCKF signal is complementary to the WCK signal. For the sake of simplicity, the WCK and WCKF signals may be referred to collectively as the WCK signal where applicable for the description of FIGS. 7A-7D. The WCK signal remains static between times Ta4 and Ta6 (e.g., static period tWCKPREstatic). That is, the WCK signal remains at a known clock level (e.g., at a low clock level) for the time period between times Ta4 and Ta6. At time Ta6, an active WCK signal provided by the controller 10 is received by the Device0. The WCK signal may have a first clock frequency followed by a second higher clock frequency (at time Ta7), as illustrated in the embodiment of FIG. 7A.

Between times Ta6 when the active WCK signal is received by the Device0 and Ta9 when the Device0 provides an active access data clock signal RDQS (e.g., time period tWCKPREtoggle), the Device0 performs WCK-CK synchronization and begins generating internal clock signals based on the WCK signal. For example, internal clock circuits (e.g., a clock divider circuit) may generate multiphase clock signals used for timing internal operations and determine a phase relationship with the WCK signal. The internal clock signals may be used to provide the RDQS signal, such as by a RDQS clock circuit that uses multiphase clock signals based on the WCK signal to generate the RDQS signal. At time Ta9, the Device0 provides the active RDQS signal to the controller 10. Also at time Ta9, or within a time period tWCKDQO, data DQ is provided from the Device0 by an input/output circuit. The data DQ is provided having a timing synchronized with the RDQS signal. For example, as shown in the embodiment of FIG. 7A, a bit of data DQ is provided for each clock edge of the RDQS signal until a data burst is complete (e.g., a 16-bit data burst is shown in FIG. 7A). FIG. 7A shows the data DQ provided from one data terminal of the Device0. While not shown in FIG. 7A, data may concurrently be provided from other data terminals of the Device0 having the same relative timing.

With reference to FIG. 7B, at time Ta-3, a select signal CS0 provided by the controller 10 is active to select the Device0. As a result, the command/address input circuit of Device0 receives a MPC command for a rising clock edge of the CK signal at time Ta-3. The MPC command represents a timing command as previously described. The MPC command includes opcode OP6=0 to disable a RDQS early mode and OP7=0 to disable a WCK-CK fast synchronization mode. The command decoder decodes the MPC command and generates the internal control signals accordingly. The select signal CS0 is active again at time Ta0 to select the Device0. A read command READ provided at time Ta0 is received by the command/address input circuit of Device0 for a rising clock edge of the CK signal at time Ta0. With the RDQS early mode and the WCK-CK fast synchronization mode disabled, the operation of FIG. 7B proceeds similarly to the operation described with reference to FIG. 7A.

As shown in FIG. 7B, unlike a CAS command, the MPC command is not limited to immediately preceding the READ command. The MPC command in FIG. 7B is provided to the Device0 three tCK before the READ command. As will be described in more detail below, decoupling the MPC command from immediately preceding the READ command may allow for RDQS signal timing that provides controller 10 with sufficient clock cycles of the RDQS signal to recover a timing from the RDQS signal and also satisfy read latency timing for slower CK clock frequencies.

Following the READ command, the WCK/WCKF input buffer of the Device0 is enabled in preparation for receiving the WCK and WCKF signals from the controller 10. The WCK signal remains static for the static period tWCKPREstatic between times Ta4 and Ta6. At time Ta6, an active WCK signal provided by the controller 10 is received by the Device0, and the Device0 performs WCK-CK synchronization and generates internal clock signals based on the WCK signal that are used to provide the RDQS signal. At time Ta9, the Device0 provides the active RDQS signal to the controller, and provides data DQ within a time period tWCKDQO of time Ta9. As with FIG. 7A, the data DQ is provided from the Device0 synchronized with the RDQS signal such that a bit of data DQ is provided for each clock edge of the RDQS signal until a data burst is complete. While FIG. 7B shows the data DQ provided from one data terminal of the Device0, data may concurrently be provided from other data terminals of the Device0 having the same relative timing.

With reference to FIG. 7C, at time Ta-3, a select signal CS0 provided by the controller 10 is active to select the Device0. As a result, Device0 receives a MPC command for a rising clock edge of the CK signal at time Ta-3. The MPC command includes opcode OP6=0 to disable the RDQS early mode and OP7=1 to enable the WCK-CK fast synchronization mode. The command decoder decodes the MPC command and generates the internal control signals to enable the WCK-CK fast synchronization mode. The WCK signal may be provided earlier relative to the timing shown in FIGS. 7A and 7B when the WCK-CK fast synchronization mode is enabled. The select signal CS0 is active again at time Ta0 to select the Device0. A read command READ provided at time Ta0 is received by Device0 for a rising clock edge of the CK signal at time Ta0.

With the WCK-CK fast synchronization mode enabled, enablement of the WCK/WCKF input buffer by the command decoder of the Device0 in preparation for receiving the WCK and WCKF signals from the controller 10 begins at time Ta-3, that is, at the time the MPC command is received by the Device0. As shown in FIG. 7C, enablement of the WCK/WCKF input buffer occurs over a time period WCKENL between times Ta-3 and Ta-1. Starting at time Ta-1, the WCK signal remains static (at the low clock level) for the static period tWCKPREstatic between times Ta-1 and Ta1. At time Ta1, an active WCK signal provided by the controller 10 is received by the Device0, and the Device0 performs WCK-CK synchronization and generates internal clock signals based on the WCK signal, which may be used to provide the RDQS signal.

In comparison to the WCK timing shown in FIGS. 7A and 7B where the WCK-CK fast synchronization mode is not enabled, the Device0 is ready to receive the WCK signal from the controller 10 earlier when the WCK-CK fast synchronization mode is enabled. For example, as shown in the example of FIG. 7C, the WCK signal is provided 5 tCKs earlier than for the examples of FIGS. 7A and 7B.

At time Ta9, the Device0 provides the active RDQS signal to the controller, and provides data DQ within a time period tWCKDQO of time Ta9. The data DQ is provided from the Device0 synchronized with the RDQS signal such that a bit of data DQ is provided for each clock edge of the RDQS signal until a data burst is complete. While FIG. 7C shows the data DQ provided from one data terminal of the Device0, data may also be provided from other data terminals of the Device0 having the same relative timing concurrently.

With reference to FIG. 7D, at time Ta-3, a select signal CS0 provided by the controller 10 is active to select the Device0. As a result, Device0 receives a MPC command for a rising clock edge of the CK signal at time Ta-3. The MPC command includes opcode OP6=1 to enable RDQS early mode and OP7=1 to enable WCK-CK fast synchronization mode. The command decoder decodes the MPC command and generates the internal control signals to enable the WCK-CK fast synchronization mode and enable the RDQS early mode for the access operation.

The RDQS signal may be provided by the Device0 earlier relative to the timing shown in FIGS. 7A-7C when the RDQS early mode is enabled. Additionally, with the WCK-CK fast synchronization mode is enabled, the WCK signal may be provided sooner relative to the timing shown in FIGS. 7A and 7B. The select signal CS0 is active again at time Ta0 to select the Device0. A read command READ provided at time Ta0 is received by Device0 for a rising clock edge of the CK signal at time Ta0.

With the WCK-CK fast synchronization mode enabled, enablement of the WCK/WCKF input buffer of the Device0 in preparation for receiving the WCK and WCKF signals from the controller 10 begins at time Ta-3, which is the time the CAS command is received by the Device0. As shown in FIG. 7D, enablement of the WCK/WCKF input buffer occurs over a time period WCKENL between times Ta-3 and Ta-1. Starting at time Ta-1, the WCK signal remains static for the static period tWCKPREstatic between times Ta-1 and Ta1.

At time Ta1, an active WCK signal provided by the controller 10 is received by the Device0, and during the time period tWCKPREtoggle the Device0 performs WCK-CK synchronization and generates internal clock signals based on the WCK signal that are used to provide the RDQS signal. At time Ta3, or within a time period tWCKDQO of time Ta3, the Device0 provides the active RDQS signal to the controller 10. In comparison to the RDQS signal timing shown in FIGS. 7A-7C where the RDQS early mode is not enabled, the RDQS signal is provided earlier when the RDQS early mode is enabled. For example, as shown in the example of FIG. 7D, the RDQS signal is provided 5 to 6 tCKs earlier than for the examples of FIGS. 7A-7C. The controller 10 may enable the RDQS early mode in order to receive the RDQS signal from Device0 and recover a timing from the RDQS signal and generate an internal timing signal based on the recovered timing. The internal timing signal generated by the controller 10 may be used to time the receipt of the data DQ from the Device0.

At time Ta9, the Device0 provides data DQ within a time period tWCKDQO of time Ta9. The data DQ is provided from the Device0 synchronized with the RDQS signal such that a bit of data DQ is provided for each clock edge of the RDQS signal until a data burst is complete (e.g., a 16-bit data burst is shown in FIG. 7D). While FIG. 7D shows the data DQ provided from one data terminal of the Device0, data may also be provided from other data terminals of the Device0 having the same relative timing concurrently.

With reference to timing of the example of FIG. 7D and applying the time periods WCKENL, tWCKPREstatic, and tWCKPREtoggle, using a CAS command instead of a MPC command for a read operation would result in the RDQS signal provided by the Device0 at time Ta6 (instead of at time Ta4 with a MPC command). In such an example, the CAS command would be received by the Device0 at time Ta-1, that is, immediately preceding the READ command at time Ta0. With the sum of the time periods WCKENL, tWCKPREstatic, and tWCKPREtoggle being 7 tCK, the earliest the RDQS signal is provided is at time Ta6 (e.g., time Ta-1 plus 7 tCK equals Ta6).

In some systems, the controller 10 may require a minimum number of RDQS clock cycles in order to recover a timing from the RDQS signal and generate an internal timing signal based on the recovered timing. Providing the RDQS signal at time Ta6, which results from using a CAS command for a read operation assuming the timing of the example of FIG. 7D, provides 16 clock cycles of the RDQS signal before time (Ta9+tWCKDQO), which is the time at which the Device0 begins providing data DQ in order to meet the read latency RL. In contrast, as shown in FIG. 7D, the MPC command results in the Device0 providing the RDQS signal at time Ta4, which provides 24 clock cycles of the RDQS signal before data DQ is provided by the Device0 at time (Ta9+tWCKDQO). The additional clock cycles of the RDQS signal prior to providing data DQ may be advantageous for some clock frequencies and when using controllers having a minimum number of RDQS clock cycles for data clock recovery.

In FIGS. 7A-7D, the time period WCKENL is shown as 2 clock cycles of the WCK signal (2 tCK), the time period tWCKPREstatic is shown as 2 tCK, and the time period tWCKPREtoggle is shown as 3 tCK. Each of the time periods WCKENL, tWCKPREstatic, and tWCKPREtoggle may be the same or different in other embodiments of the disclosure.

Figure 8:
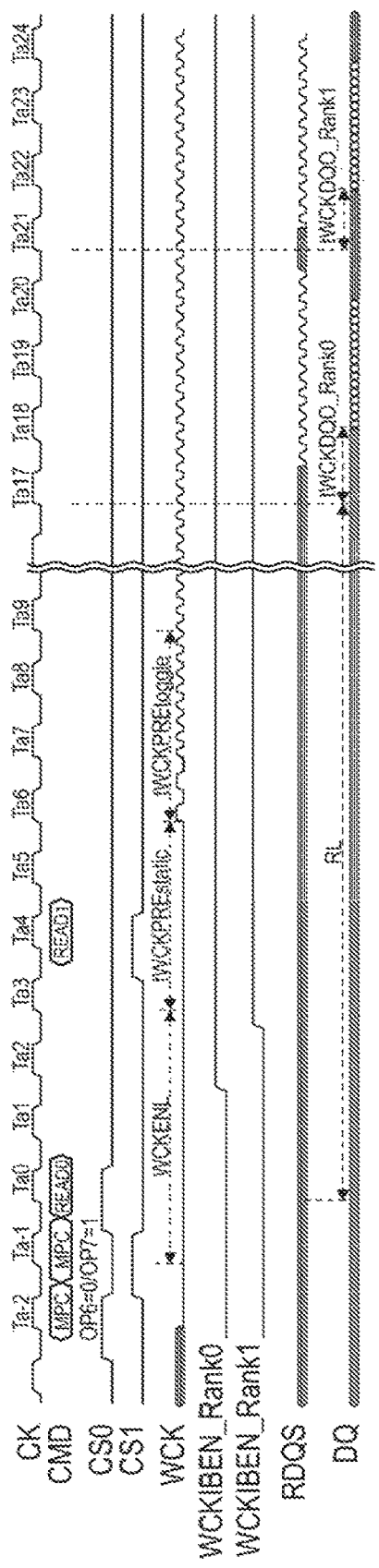
FIGS. 8 and 9 are timing diagrams showing various signals during access operations for two ranks of memory according to various embodiments of the disclosure.
Figure 9:
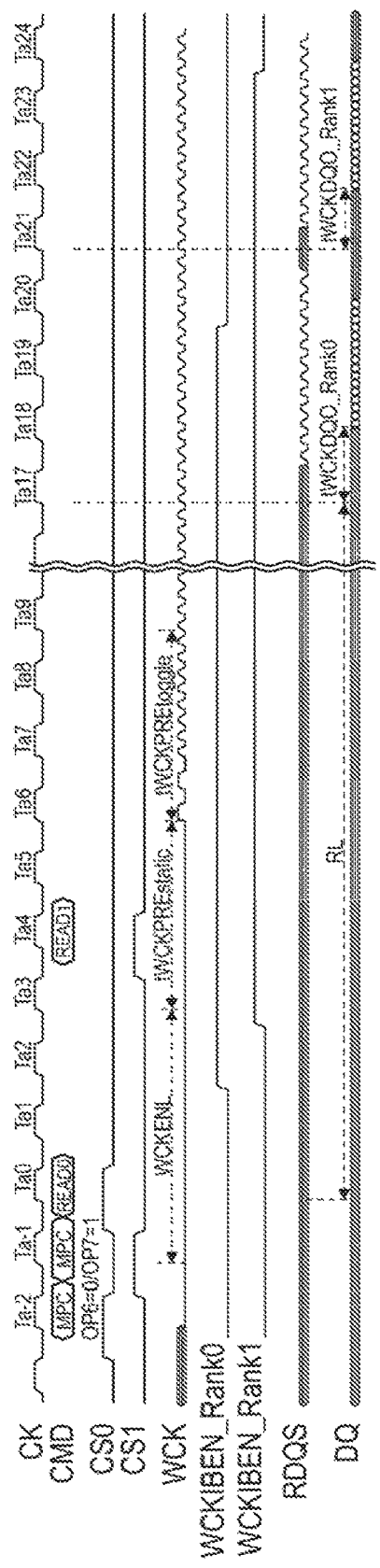

FIGS. 8 and 9 are timing diagrams showing various signals during access operations for two ranks of memory according to various embodiments of the disclosure. Each rank is represented by a respective device, in particular, Rank0 corresponds to Device0, which is selected by an active select signal CS0 and Rank1 corresponds to Device which is selected by an active select signal CS1. In other embodiments of the disclosure, there may be greater than two ranks. Additionally, in some embodiments of the disclosure a rank may include a plurality of devices.

FIGS. 8 and 9 will be described with reference to read operations for a system including a controller and a memory system. In some embodiments of the disclosure, the system 100 of FIG. 1 may be used for the operation described with reference to FIGS. 8 and 9. FIGS. 8 and 9 will be described with reference to the system 100 of FIG. 1, but the scope of the disclosure is not limited to the particular system 100. The read latency for the read operation of FIGS. 8 and 9 is 17 tCK (e.g., 17 clock cycles of the CK signal). The timing diagram of FIG. 8 assumes that the WCK always on option is enabled (e.g., WCKaon=1 for the corresponding mode register setting for the memories 110). With the WCK always on option enabled, the controller 10 provides a continuously active WCK signal after Device0 and Device1 are both prepared to receive the WCK signal, as will be described in greater detail below.

With reference to FIG. 8, at time Ta-2, a select signal CS0 provided by the controller 10 is active to select the Device0 (Rank0). As a result, a command/address input circuit of Device0 receives a MPC command for a rising clock edge of the CK signal at time Ta-2. At time Ta-1, a select signal CS1 provided by the controller 10 is active to select the Device (Rank1). As a result, a command/address input circuit of Device1 receives a MPC command for a rising clock edge of the CK signal at time Ta-1. The MPC commands at times Ta-2 and Ta-1 include opcode OP6=0 to disable RDQS early mode and OP7=1 to enable WCK-CK fast synchronization mode. As previously described, the WCK signal may be provided earlier when the WCK-CK fast synchronization mode is enabled in comparison to when the WCK fast synchronization mode is not enabled.

With the WCK-CK fast synchronization mode enabled, the WCK/WCKF input buffers of Device0 and Device1 are enabled by receiving the MPC commands in preparation for receiving the WCK and WCKF signals from the controller 10. The WCKF signal is not shown in FIGS. 8 and 9. As previously described, the WCKF signal is complementary to the WCK signal. For the sake of simplicity, the WCK and WCKF signals may be referred to collectively as the WCK signal where applicable for the description of FIGS. 8 and 9.

The WCK/WCKF buffer of Device0 is enabled starting at time Ta-2 and the WCK/WCKF buffer of Device1 is enabled starting at time Ta-1. FIG. 8 illustrates the timing for the Device1, but not for Device0 for the sake of simplifying the figure. It will be understood that the timing for enabling the WCK/WCKF buffer of Device0 is the same as for enabling the WCK/WCKF buffer of Device1, but beginning and ending 1 tCK earlier than for Device1. As shown in FIG. 8, enablement of the WCK/WCKF input buffer for Device1 occurs over a time period WCKENL between times Ta-1 and Ta3 (as represented in FIG. 8 by the WCK IB enable for Rank1 becoming active around time Ta3), and enablement of the WCK/WCKF input buffer for Device0 occurs over a time period WCKENL between times Ta-2 and Ta2 (as represented in FIG. 8 by the WCK IB enable for Rank0 becoming active around time Ta2).

The controller 10 provides a static WCK signal following the latest enabled WCK/WCKF input buffer, which in the example of FIG. 8 is the WCK/WCKF input buffer of Device1. In particular, starting at time Ta3, the WCK signal remains static (at the low clock level) for the static period tWCKPREstatic between times Ta3 and Ta6. At time Ta6, an active WCK signal provided by the controller 10 is received by Device0 and Device1. Both Device0 and Device1 perform WCK-CK synchronization and generate internal clock signals based on the WCK signal that are used to provide the RDQS signal.

Referring back to time Ta0, the select signal CS0 is active to select the Device0 so that a read command READ provided at time Ta0 is received by Device0 for a rising clock edge of the CK signal. With a read latency of 17 tCKs, data for the READ command at time Ta0 will be provided by Device0 following time Ta17. The select signal CS1 is active at time Ta4 to select the Device1 so that a read command READ is received by Device1 for a rising clock edge of the CK signal at time Ta4. With a read latency of 17 tCKs, data for the READ command at time Ta4 will be provided by Device1 following time Ta21.

Following time Ta17 and for the READ command of time Ta0 (for Rank0), the Device0 provides the active RDQS signal to the controller 10, and provides data DQ within a time period tWCKDQO of time Ta17. The data DQ is provided from the Device0 synchronized with the RDQS signal such that a bit of data DQ is provided for each clock edge of the RDQS signal until a data burst is complete (e.g., a 16-bit data burst is shown in FIG. 8). While FIG. 8 shows the data DQ provided from one data terminal of the Device0, data may also be provided from other data terminals of the Device0 having the same relative timing concurrently.

Following time Ta21 and for the READ command of time Ta4 (for Rank1), the Device provides the active RDQS signal to the controller 10, and provides data DQ within a time period tWCKDQO of time Ta21. The data DQ is provided from the Device1 synchronized with the RDQS signal such that a bit of data DQ is provided for each clock edge of the RDQS signal until a data burst is complete (e.g., a 16-bit data burst is shown in FIG. 8). While FIG. 8 shows the data DQ provided from one data terminal of the Device1, data may also be provided from other data terminals of the Device1 having the same relative timing concurrently.

The input buffers of the Device0 and Device1 remain enabled although no read commands are provided to the Device0 and Device1 subsequent to the respective read commands. That is, with the WCK always on option enabled in the example of FIG. 8, as previously described, the WCK/WCKF input buffers of Device0 and Device1 remain enabled. However, while not shown in FIG. 8, the WCK/WCKF input buffers of Device0 and Device1 may be disabled using a CAS command or MPC command, with the opcode OP7=0, that is, with WCK-CK fast synchronization mode disabled.

With reference to FIG. 9, the timing diagram of FIG. 9 assumes that the WCK always on option is disabled (e.g., WCKaon=0 for the corresponding mode register setting for the memories 110). With the WCK always on option disabled, WCK/WCKF input buffers of Device0 and Device1 are disabled following completion of a read command. The WCK/WCKF input buffer may remain enabled when another read command is received by the device before completing a previous read command. In contrast, as previously described with reference to FIG. 8, when the WCK always on option is enabled, the WCK/WCKF input buffers of Device0 and Device1 remain enabled and may be disabled when the respective device receives a CAS command or MPC command with opcode OP7=0 to disable the WCK-CK fast synchronization mode.

The timing of the signals shown in FIGS. 8 and 9 are similar, except for the WCK IB Enable signal for Device0 and Device1 (Rank0 and Rank1). For example, following time Ta19, the WCK IB Enable signal for Rank0 becomes inactive (inactive low logic level) indicating the disablement of the WCK/WCKF input buffer of Device0. Similarly, following time Ta23, the WCK IB Enable signal for Rank1 becomes inactive (inactive low logic level) indicating the disablement of the WCK/WCKF input buffer of Device1. The WCK/WCKF input buffers of Device0 and Device1 are disabled following completion of the respective read commands, as previously described for the WCK always on option disabled (WCKaon=0). However, although not shown in FIG. 9, the WCK/WCKF input buffers of Device0 and Device1 remain enabled when a read command is received by a device before completion of a previous read command for that device.

While FIGS. 8 and 9 show separate MPC commands provided to Device0 and Device1, in some embodiments of the disclosure, one MPC command may be provided and received by Device0 and Device1 simultaneously. In particular, one MPC command may be received by Device0 and Device1 simultaneously by having the select signals CS0 and CS1 both active at the time the MPC command is provided. As a result, both Device0 and Device1 receive the MPC command simultaneously.

FIGS. 10A-1 and 10A-2, 10B, and 10C are timing diagrams showing various signals during access operations for two ranks of memory according to various embodiments of the disclosure. Each rank is represented by a respective device, in particular, Rank0 corresponds to Device0, which is selected by an active select signal CS0 and Rank1 corresponds to Device1 which is selected by an active select signal CS1. In other embodiments of the disclosure, there may be greater than two ranks. Additionally, in some embodiments of the disclosure a rank may include a plurality of devices.

FIGS. 10A-1 and 10A-2, 10B, and 10C will be described with reference to read operations for a system including a controller and a memory system. In some embodiments of the disclosure, the system 100 of FIG. 1 may be used for the operation described with reference to FIGS. 10A-1 and 10A-2, 10B, and 10C. FIGS. 10A-1 and 10A-2, 10B, and 10C will be described with reference to the system 100 of FIG. 1, but the scope of the disclosure is not limited to the particular system 100. The timing diagrams of FIGS. 10A-1 and 10A-2, 10B, and 10C assume that the WCK always on option is enabled (e.g., WCKaon=1 for the corresponding mode register setting). As previously described, with the WCK always on option enabled, the controller 10 provides a continuously active WCK signal after Device0 and Device1 are both prepared to receive the WCK signal, as will be described in greater detail below. Additionally, as previously described, with the WCK always on option enabled, the input buffers of Device0 and Device1 remain enabled following completion of an access command. As also previously described, the WCK/WCKF input buffers of Device0 and Device1 may be disabled using a CAS command or MPC command, with the opcode OP7=0, that is, with WCK-CK fast synchronization mode disabled.

Figures 1, 10A:
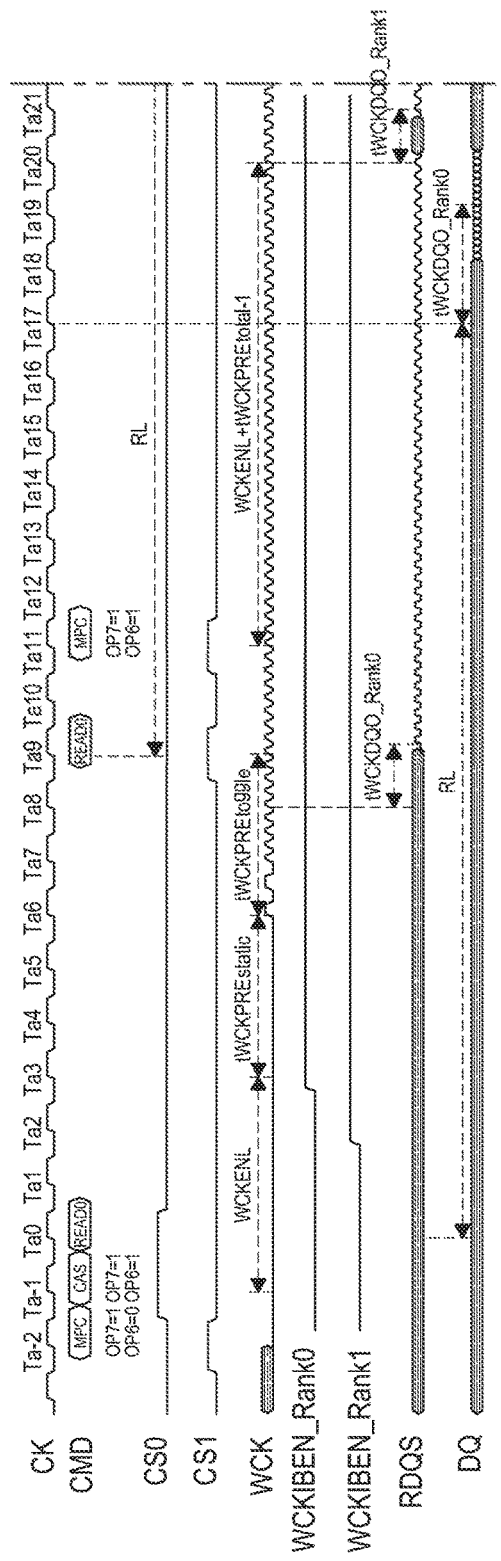
Figures 2, 10A:
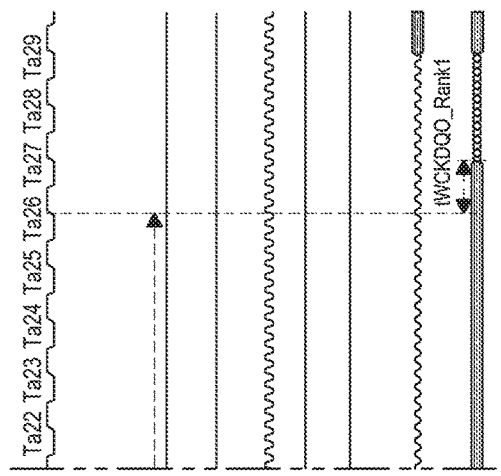
Figure 10B:
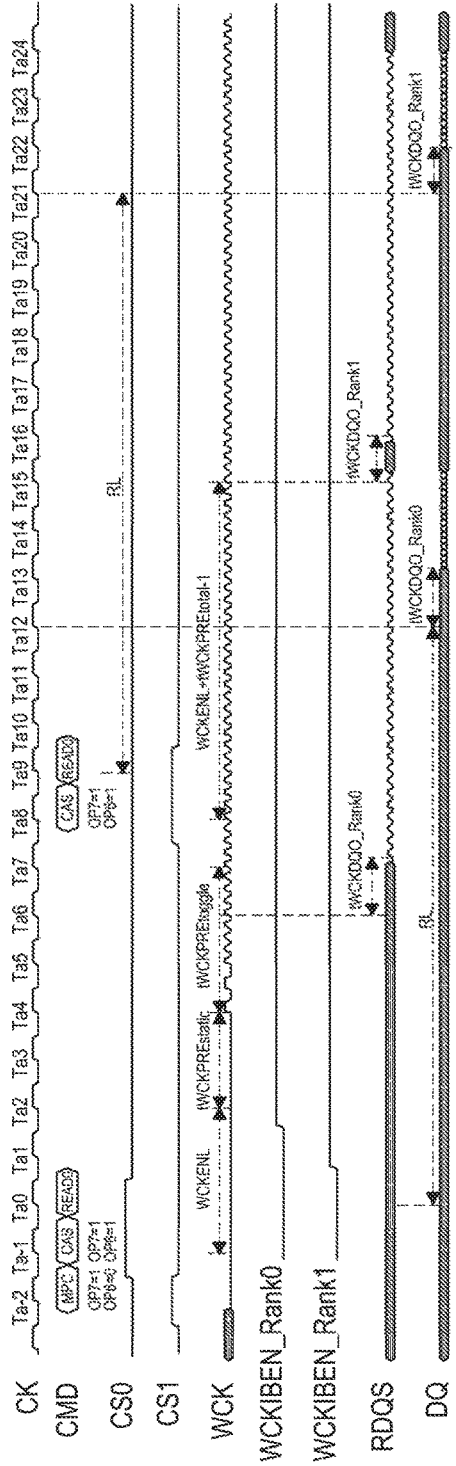
Figure 10C:
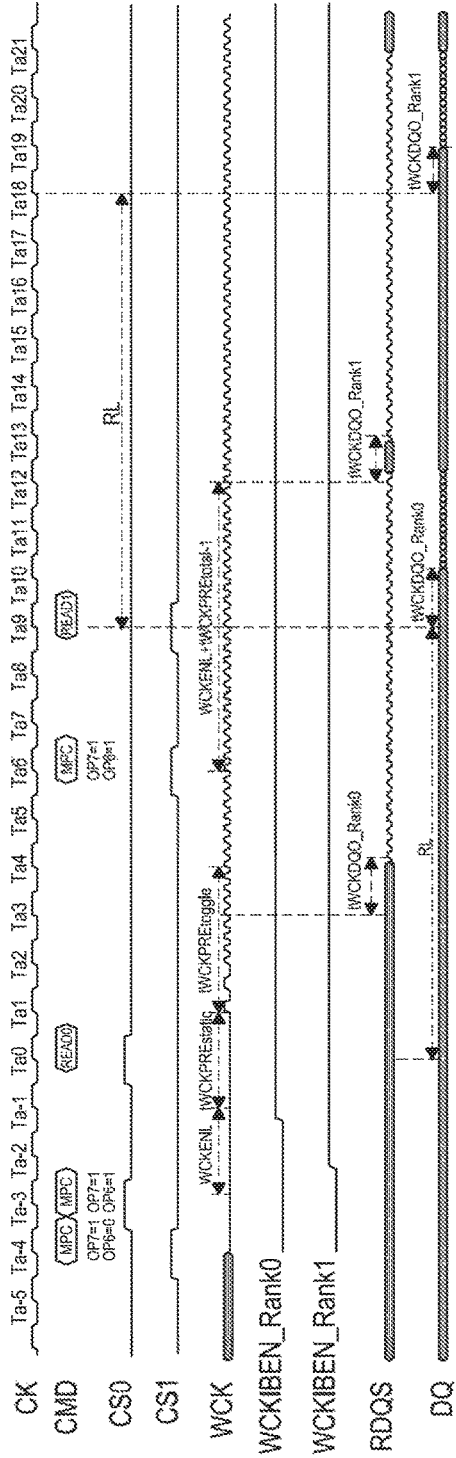

The read latency for the read operations of FIGS. 10A-1 and 10A-2, 10B, and 10C are different, as will be described in more detail below. The different read latencies for the three read operations results from different clock frequencies of the CK signal (and CKF signal). The clock frequency for the CK signal of FIGS. 10A-1 and 10A-2 are the fastest (and highest tCK count for the read latency) of the three read operations, and the clock frequency for the CK signal of FIG. 10C is the slowest (and lowest tCK count for the read latency) of the three read operations.

With reference to FIGS. 10A-1 and 10A-2, the read latency for the read operation is 17 tCK (e.g., 17 clock cycles of the CK signal). FIG. 10A-1 is continued on FIG. 10A-2 (collectively referred to as FIG. 10A). At time Ta-2, a select signal CS1 provided by the controller 10 is active to select Device1 (Rank1). As a result, Device1 receives a MPC command for a rising clock edge of the CK signal at time Ta-2. At time Ta-1, a select signal CS0 provided by the controller 10 is active to select the Device0 (Rank0). As a result, Device0 receives a CAS command for a rising clock edge of the CK signal at time Ta-1. The MPC command at time Ta-2 includes opcode OP6=0 to disable RDQS early mode and OP7=1 to enable WCK-CK fast synchronization mode. The CAS command at time Ta-1 includes opcode OP6=1 to enable RDQS early mode and OP7=1 to enable WCK-CK fast synchronization mode. As previously described, the RDQS signal may be provided by the Device0 earlier when the RDQS early mode is enabled in comparison to when the RDQS early mode is not enabled. Additionally, the WCK signal may be provided earlier when the WCK-CK fast synchronization mode is enabled in comparison to when the WCK fast synchronization mode is not enabled. The select signal CS0 is active at time Ta0 to select the Device0 so that a read command READ is received by Device0 for a rising clock edge of the CK signal at time Ta0. With a read latency of 17 tCKs, data for the READ command at time Ta0 will be provided by Device0 following time Ta17.

FIG. 10A illustrates the use of the MPC command and the CAS command for access operations. The MPC command at time Ta-2 is provided to set the RDQS early mode and the WCK-CK fast synchronization mode for Device1. The CAS command at time Ta-1 is used to set the RDQS early mode and the WCK-CK fast synchronization mode for Device0, and immediately precedes the READ command at time Ta0 for Device0.

With the WCK-CK fast synchronization mode enabled for both Device0 and Device1, the WCK/WCKF input buffers of Device0 and Device1 are enabled by receiving the CAS command and the MPC command, respectively, in preparation for receiving the WCK and WCKF signals from the controller 10. The WCKF signal is not shown in FIGS. 10A-1 and 10A-2, 10B, and 10C. As previously described, the WCKF signal is complementary to the WCK signal. For the sake of simplicity, the WCK and WCKF signals may be referred to collectively as the WCK signal where applicable for the description of FIGS. 10A-1 and 10A-2, 10B, and 10C.

The WCK/WCKF buffer of Device1 is enabled starting at time Ta-2 and the WCK/WCKF buffer of Device0 is enabled starting at time Ta-1. FIG. 10A illustrates the timing for the Device0, but not for Device1 for the sake of simplifying the figure. It will be understood that the timing for enabling the WCK/WCKF buffer of Device0 is the same as for enabling the WCK/WCKF buffer of Device0, but beginning and ending 1 tCK earlier than for Device0. As shown in FIG. 10A, enablement of the WCK/WCKF input buffer for Device0 occurs over a time period WCKENL between times Ta-1 and Ta3 (as represented in FIG. 10A by the WCK IB enable for Rank0 becoming active around time Ta3), and enablement of the WCK/WCKF input buffer for Device1 occurs over a time period WCKENL between times Ta-2 and Ta2 (as represented in FIG. 10A by the WCK IB enable for Rank1 becoming active around time Ta2).

The controller 10 provides a static WCK signal following the latest enabled WCK/WCKF input buffer, which in the example of FIG. 10A is the WCK/WCKF input buffer of Device0. In particular, starting at time Ta3, the WCK signal remains static (at the low clock level) for the static period tWCKPREstatic between times Ta3 and Ta6. At time Ta6, an active WCK signal provided by the controller 10 is received by Device0 and Device1. Both Device0 and Device1 perform WCK-CK synchronization concurrently and generate internal clock signals based on the WCK signal that are used to provide the RDQS signal. Concurrent WCK-CK synchronization by both Device0 and Device1 may take less time than performing WCK-CK synchronization sequentially for Device0 and Device1.

At time Ta8, or within a time period tWCKDQO of time Ta8, the Device0 provides the active RDQS signal to the controller 10. As previously described, the RDQS signal may be provided by the Device0 earlier when the RDQS early mode is enabled in comparison to when the RDQS early mode is not enabled. As previously described, the controller 10 may enable the RDQS early mode in order to receive the RDQS signal from Device0 and recover a timing from the RDQS signal and generate an internal timing signal based on the recovered timing. The internal timing signal generated by the controller 10 may be used to time the receipt of the data DQ from the Device0.

The select signal CS1 is active at time Ta9 to select the Device1 so that a read command READ is received by Device1 for a rising clock edge of the CK signal at time Ta9. With a read latency of 17 tCKs, data for the READ command at time Ta9 will be provided by Device following time Ta26. The select signal CS1 is active again at time Ta11 to select the Device1. A MPC command provided at time Ta11 is received by Device1 at a rising clock edge of the CK signal at time Ta11. The MPC command at time Ta11 includes opcode OP6=1 to enable RDQS early mode and OP7=1 to enable WCK-CK fast synchronization mode.

Within a time period tWCKDQO of time Ta8, Device0 provides the active RDQS signal to the controller 10. The Device0 also provides data DQ within a time period tWCK-DQO of time Ta17. The data DQ is provided from the Device0 synchronized with the RDQS signal such that a bit of data DQ is provided for each clock edge of the RDQS signal until a data burst is complete (e.g., a 16-bit data burst is shown in FIG. 10A). While FIG. 10A shows the data DQ provided from one data terminal of the Device0, data may also be provided from other data terminals of the Device0 having the same relative timing concurrently.

Within a time period tWCKDQO of time Ta20, Device1 provides the active RDQS signal to the controller 10. The Device1 also provides data DQ within a time period tWCK-DQO of time Ta26. The data DQ is provided from the Device1 synchronized with the RDQS signal such that a bit of data DQ is provided for each clock edge of the RDQS signal until a data burst is complete. While FIG. 10A shows the data DQ provided from one data terminal of the Device1, data may also be provided from other data terminals of the Device1 having the same relative timing concurrently.

FIG. 10A illustrates the use of the MPC command at time Ta11 after an associated READ command at time Ta9. The MPC command may have a timing relative to the associated access command to reduce unnecessary clocking of the RDQS signal provided by Device1. For example, if a CAS command immediately preceding the READ command at time Ta9 is used instead of the MPC command at time Ta11, Device1 would begin providing the RDQS signal at time Ta17 (e.g., Tag for the CAS command and 9 tCK of the CK signal (WCKENL+tWCKPREstatic+tWCKPREtoggle) before providing the RDQS signal). However, the RDQS signal for Device1 is not needed until later. Thus, in the present example, using a CAS command and READ command sequential pair instead of a MPC command would result in three tCK of unnecessary RDQS clocking.

With reference to FIG. 10B, the read latency for the read operation is 12 tCK (e.g., 12 clock cycles of the CK signal). At time Ta-2, a select signal CS1 provided by the controller 10 is active to select Device1 (Rank1). As a result, Device1 receives a MPC command for a rising clock edge of the CK signal at time Ta-2. At time Ta-1, a select signal CS0 provided by the controller 10 is active to select the Device0 (Rank0). As a result, Device0 receives a CAS command for a rising clock edge of the CK signal at time Ta-1. The MPC command at time Ta-2 includes opcode OP6=0 to disable RDQS early mode and OP7=1 to enable WCK-CK fast synchronization mode. The CAS command at time Ta-1 includes opcode OP6=1 to enable RDQS early mode and OP7=1 to enable WCK-CK fast synchronization mode. The select signal CS0 is active at time Ta0 to select the Device0 so that a read command READ is received by Device0 for a rising clock edge of the CK signal at time Ta0. With a read latency of 12 tCKs, data for the READ command at time Ta0 will be provided by Device0 following time Ta12.

As with the read operation of FIG. 10A, FIG. 10B illustrates the use of the MPC command and the CAS command for access operations. The MPC command at time Ta-2 is provided to set the RDQS early mode and the WCK-CK fast synchronization mode for Device1. The CAS command at time Ta-1 is used to set the RDQS early mode and the WCK-CK fast synchronization mode for Device0, and immediately precedes the READ command at time Ta0 for Device0.

With the WCK-CK fast synchronization mode enabled for both Device0 and Device1, the WCK/WCKF input buffers of Device0 and Device1 are enabled by receiving the CAS command and the MPC command, respectively, in preparation for receiving the WCK and WCKF signals from the controller 10. The WCK/WCKF buffer of Device1 is enabled starting at time Ta-2 and the WCK/WCKF buffer of Device0 is enabled starting at time Ta-1. As with FIG. 10A, FIG. 10B illustrates the timing for the Device0, but not for Device1 for the sake of simplifying the figure. As shown in FIG. 10B, enablement of the WCK/WCKF input buffer for Device0 occurs over a time period WCKENL between times Ta-1 and Ta2 (as represented in FIG. 10B by the WCK IB enable for Rank0 becoming active around time Ta2), and enablement of the WCK/WCKF input buffer for Device1 occurs over a time period WCKENL between times Ta-2 and Ta1 (as represented in FIG. 10B by the WCK IB enable for Rank1 becoming active around time Ta1).

The controller 10 provides a static WCK signal following the latest enabled WCK/WCKF input buffer, which in the example of FIG. 10B is the WCK/WCKF input buffer of Device0. In particular, starting at time Ta2, the WCK signal remains static (at the low clock level) for the static period tWCKPREstatic between times Ta2 and Ta4. At time Ta4, an active WCK signal provided by the controller 10 is received by Device0 and Device1. Both Device0 and Device1 perform WCK-CK synchronization concurrently and generate internal clock signals based on the WCK signal that are used to provide the RDQS signal. At time Ta6, or within a time period tWCKDQO of time Ta6, the Device0 provides the active RDQS signal to the controller 10.

The select signal CS1 is active at time Ta8 to select the Device1. A CAS command provided at time Ta8 is received by Device1 at a rising clock edge of the CK signal at time Ta8. The CAS command at time Tag includes opcode OP6=1 to enable RDQS early mode and OP7=1 to enable WCK-CK fast synchronization mode. The select signal CS1 is again active at time Ta9 to select the Device so that a read command READ is received by Device1 for a rising clock edge of the CK signal at time Ta9. With a read latency of 12 tCKs, data for the READ command at time Ta9 will be provided by Device1 following time Ta21.

In contrast to the read operation of FIG. 10A, FIG. 10B shows the use of the CAS command and READ command sequential pair for the access operation of Device1 (instead of using an MPC command). Unnecessary clocking of the RDQS signal is avoided in the example of FIG. 10B because the read latency is such that the RDQS signal is provided with desirable timing using the CAS command and READ command.

The Device0 provides data DQ within a time period tWCKDQO of time Ta12. The data DQ is provided from the Device0 synchronized with the RDQS signal such that a bit of data DQ is provided for each clock edge of the RDQS signal until a data burst is complete (e.g., a 16-bit data burst is shown in FIG. 10B). While FIG. 10B shows the data DQ provided from one data terminal of the Device0, data may also be provided from other data terminals of the Device0 having the same relative timing concurrently.

Within a time period tWCKDQO of time Ta15, Device1 provides the active RDQS signal to the controller 10. The Device1 also provides data DQ within a time period tWCK-DQO of time Ta21. The data DQ is provided from the Device1 synchronized with the RDQS signal such that a bit of data DQ is provided for each clock edge of the RDQS signal until a data burst is complete. While FIG. 10B shows the data DQ provided from one data terminal of the Device1, data may also be provided from other data terminals of the Device1 having the same relative timing concurrently.

With reference to FIG. 10C, the read latency for the read operation is 9 tCK (e.g., 9 clock cycles of the CK signal). At time Ta-4, a select signal CS1 provided by the controller 10 is active to select Device1 (Rank1) so that Device1 receives a MPC command for a rising clock edge of the CK signal at time Ta-4. At time Ta-3, a select signal CS0 provided by the controller 10 is active to select the Device0 (Rank0) so that Device0 receives a CAS command for a rising clock edge of the CK signal at time Ta-3. The MPC command at time Ta-4 includes opcode OP6=0 to disable RDQS early mode and OP7=1 to enable WCK-CK fast synchronization mode. The CAS command at time Ta-3 includes opcode OP6=1 to enable RDQS early mode and OP7=1 to enable WCK-CK fast synchronization mode. The select signal CS0 is active again at time Ta0 to select the Device0 so that a read command READ is received by Device0 for a rising clock edge of the CK signal at time Ta0. With a read latency of 9 tCKs, data for the READ command at time Ta0 will be provided by Device0 following time Ta9.

In contrast to the access operations of FIGS. 10A and 10B, MPC commands are used to begin initialization of the WCK/WCKF input buffers of Device0 and Device1 to begin concurrent WCK-CK synchronization and the generation of respective RDQS signals.

With the WCK-CK fast synchronization mode enabled for both Device0 and Device1, the WCK/WCKF input buffers of Device0 and Device1 are enabled by receiving the CAS command and the MPC command, respectively, in preparation for receiving the WCK and WCKF signals from the controller 10. The WCK/WCKF buffer of Device1 is enabled starting at time Ta-2 and the WCK/WCKF buffer of Device0 is enabled starting at time Ta-1. As with FIGS. 10A and 10B, FIG. 10C illustrates the timing for the Device0, but not for Device1 for the sake of simplifying the figure. As shown in FIG. 10C, enablement of the WCK/WCKF input buffer for Device0 occurs over a time period WCKENL between times Ta-3 and Ta-1 (as represented in FIG. 10C by the WCK IB enable for Rank0 becoming active around time Ta-1), and enablement of the WCK/WCKF input buffer for Device1 occurs over a time period WCKENL between times Ta-4 and Ta-2 (as represented in FIG. 10C by the WCK B enable for Rank1 becoming active around time Ta-2).

The controller 10 provides a static WCK signal following the latest enabled WCK/WCKF input buffer, which in the example of FIG. 10C is the WCK/WCKF input buffer of Device0. In particular, starting at time Ta-1, the WCK signal remains static (at the low clock level) for the static period tWCKPREstatic between times Ta-1 and Ta1. At time Ta1, an active WCK signal provided by the controller 10 is received by Device0 and Device1. Both Device0 and Device1 perform WCK-CK synchronization concurrently and generate internal clock signals based on the WCK signal that are used to provide the RDQS signal. At time Ta3, or within a time period tWCKDQO of time Ta3, the Device0 provides the active RDQS signal to the controller 10.

The select signal CS1 is active at time Ta6 to select the Device1 so that a MPC command provided at time Ta6 is received by Device1 at a rising clock edge of the CK signal at time Ta6. The MPC command at time Ta6 includes opcode OP6=1 to enable RDQS early mode and OP7=1 to enable WCK-CK fast synchronization mode. The select signal CS1 is again active at time Ta9 to select the Device1 so that a read command READ is received by Device1 for a rising clock edge of the CK signal at time Ta9. With a read latency of 9 tCKs, data for the READ command at time Ta9 will be provided by Device1 following time Ta9.

The Device0 provides data DQ within a time period tWCKDQO of time Ta9. The data DQ is provided from the Device0 synchronized with the RDQS signal such that a bit of data DQ is provided for each clock edge of the RDQS signal until a data burst is complete (e.g., a 16-bit data burst is shown in FIG. 10C). While FIG. 10C shows the data DQ provided from one data terminal of the Device0, data may also be provided from other data terminals of the Device0 having the same relative timing concurrently.

Within a time period tWCKDQO of time Ta12, Device1 provides the active RDQS signal to the controller 10. The Device1 also provides data DQ within a time period tWCKDQO of time Ta18. The data DQ is provided from the Device1 synchronized with the RDQS signal such that a bit of data DQ is provided for each clock edge of the RDQS signal until a data burst is complete. While FIG. 10C shows the data DQ provided from one data terminal of the Device1, data may also be provided from other data terminals of the Device1 having the same relative timing concurrently.

FIGS. 11A-1 and 11A-2 and 11B-1 and 11B-2 are timing diagrams showing various signals during access operations for two ranks of memory according to various embodiments of the disclosure. Each rank is represented by a respective device, in particular, Rank0 corresponds to Device0, which is selected by an active select signal CS0 and Rank1 corresponds to Device1 which is selected by an active select signal CS1. In other embodiments of the disclosure, there may be greater than two ranks. Additionally, in some embodiments of the disclosure a rank may include a plurality of devices.

FIGS. 11A-1 and 11A-2 and 11B-1 and 11B-2 will be described with reference to read operations for a system including a controller and a memory system. In some embodiments of the disclosure, the system 100 of FIG. 1 may be used for the operation described with reference to FIGS. 11A-1 and 11A-2 and 11B-1 and 11B-2. FIGS. 11A-1 and 11A-2 and 11B-1 and 11B-2 will be described with reference to the system 100 of FIG. 1, but the scope of the disclosure is not limited to the particular system 100. The timing diagrams of FIGS. 11A-1 and 11A-2 and 11B-1 and 11B-2 assume that the WCK always on option is disabled (e.g., WCKaon=0 for the corresponding mode register setting). As previously described, with the WCK always on option disabled, the input buffers for the WCK signal of Device0 and Device1 are disabled following completion of an access command.

FIGS. 11A-1 and 11A-2 and 11B-1 and 11B-2 illustrate WCK-CK synchronization for Rank0 and Rank1 performed sequentially, in contrast to WCK-CK synchronization for Rank0 and Rank1 performed concurrently.

Figures 1, 11A:
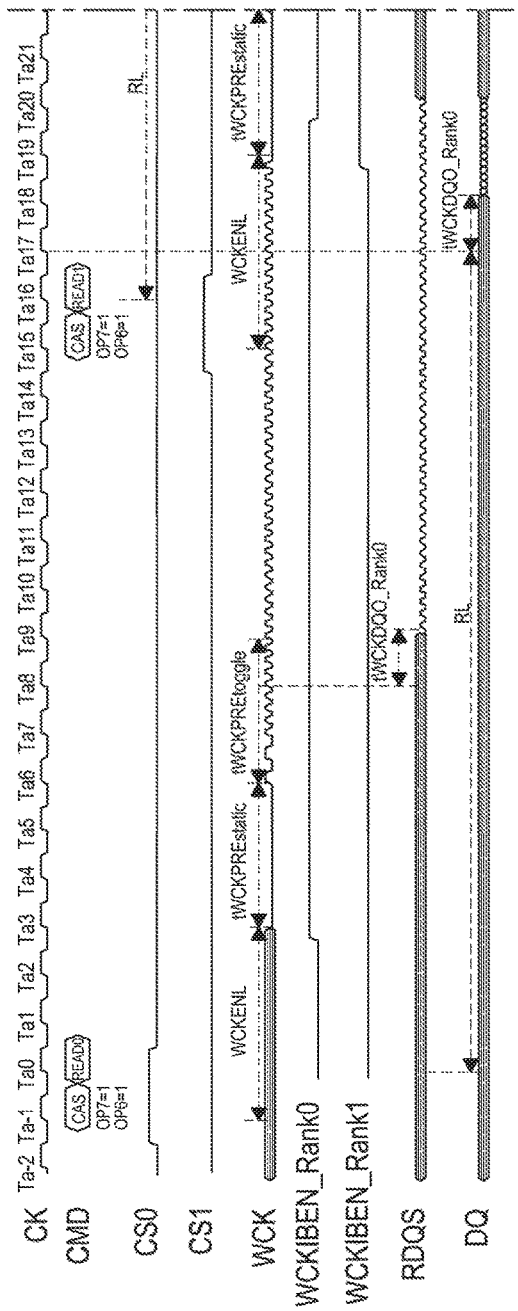
Figures 2, 11A:
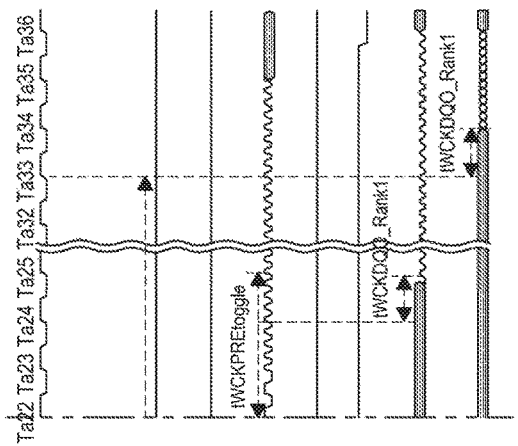

With reference to FIGS. 11A-1 and 11A-2, the read latency for the read operation is 17 tCK (e.g., 17 clock cycles of the CK signal). FIG. 11A-1 is continued on FIG. 11A-2 (collectively referred to herein as FIG. 11A). At time Ta-1, a select signal CS0 provided by the controller 10 is active to select Device0 (Rank0). As a result, Device0 receives a CAS command for a rising clock edge of the CK signal at time Ta-1. The CAS command at time Ta-1 includes opcode OP6=1 to enable RDQS early mode and OP7=1 to enable WCK-CK fast synchronization mode. The select signal CS0 is active at time Ta0 to select the Device0 so that a read command READ is received by Device0 for a rising clock edge of the CK signal at time Ta0. With a read latency of 17 tCKs, data for the READ command at time Ta0 will be provided by Device0 following time Ta17.

The WCK/WCKF buffer of Device0 is enabled starting at time Ta-1 in response to the CAS command. As shown in FIG. 11A, enablement of the WCK/WCKF input buffer for Device0 occurs over a time period WCKENL between times Ta-1 and Ta3 (as represented in FIG. 11A by the WCK IB enable for Rank0 becoming active around time Ta3). The controller 10 provides a static WCK signal following the WCK/WCKF input buffer of Device0. In particular, starting at time Ta3, the WCK signal remains static (at the low clock level) for the static period tWCKPREstatic between times Ta3 and Ta6. At time Ta6, an active WCK signal provided by the controller 10 is received by Device0. Device0 performs WCK-CK synchronization and generates internal clock signals based on the WCK signal that are used to provide the RDQS signal.

At time Ta8, or within a time period tWCKDQO of time Ta8, the Device0 provides the active RDQS signal to the controller 10. As previously described, the RDQS signal may be provided by the Device0 earlier when the RDQS early mode (opcode OP7=1) is enabled in comparison to when the RDQS early mode is not enabled. The Device0 also provides data DQ within a time period tWCKDQO of time Ta17. The data DQ is provided from the Device0 synchronized with the RDQS signal such that a bit of data DQ is provided for each clock edge of the RDQS signal until a data burst is complete (e.g., a 16-bit data burst is shown in FIG. 10A). The input buffer for Device0 is disabled around time Ta20, as represented in FIG. 11A by the WCK IB enable for Rank0 becoming inactive around time Ta20.

The select signal CS1 is active at time Ta15 so that a CAS command is received by the Device1 (Rank1). The CAS command at time Ta15 includes opcode OP6=1 to enable RDQS early mode and OP7=1 to enable WCK-CK fast synchronization mode. The select signal CS1 is active at time Ta16 to select the Device1 so that a read command READ is received by Device1 for a rising clock edge of the CK signal at time Ta16. With a read latency of 17 tCKs, data for the READ command at time Ta16 will be provided by Device1 following time Ta33.

The WCK/WCKF buffer of Device1 is enabled starting at time Ta15 in response to the CAS command. Enablement of the WCK/WCKF input buffer for Device occurs over a time period WCKENL between times Ta15 and Ta19 (as represented in FIG. 11A by the WCK IB enable for Rank1 becoming active around time Ta19). The controller 10 provides a static WCK signal following the WCK/WCKF input buffer of Device1. In particular, starting at time Ta19, the WCK signal remains static (at the low clock level) for the static period tWCKPREstatic between times Ta19 and Ta22. At time Ta22, an active WCK signal provided by the controller 10 is received by Device1. Device1 performs WCK-CK synchronization and generates internal clock signals based on the WCK signal that are used to provide the RDQS signal.

At time Ta24, or within a time period tWCKDQO of time Ta24, the Device1 provides the active RDQS signal to the controller 10. The Device1 provides data DQ within a time period tWCKDQO of time Ta33. The data DQ is provided from the Device1 synchronized with the RDQS signal such that a bit of data DQ is provided for each clock edge of the RDQS signal until a data burst is complete (e.g., a 16-bit data burst is shown in FIG. 11A). The input buffer for Device1 is disabled around time Ta36, as represented in FIG. 11A by the WCK IB enable for Rank1 becoming inactive around time Ta36.

In comparison to the timing of FIG. 11A, the timing of FIGS. 11B-1 and 11B-2 result in data being provided by Device1 (Rank1) sooner and unnecessary clock cycles of the RDQS signal may be avoided. FIG. 11B-1 is continued on FIG. 11B-2 (collectively referred to as FIG. 11B). As will be described in more detail below, the timing of FIG. 11B uses the MPC command, whereas the timing of FIG. 11A uses the CAS command.

With reference to FIG. 11B, the select signal CS0 is active at time Ta0 to select the Device0 (Rank0) so that a read command READ is received by Device0 for a rising clock edge of the CK signal at time Ta0. With a read latency of 17 tCKs, data for the READ command at time Ta0 will be provided by Device0 following time Ta17. At time Ta2, a select signal CS0 provided by the controller 10 is active to select Device0. As a result, Device0 receives a MPC command for a rising clock edge of the CK signal at time Ta2. The MPC command at time Ta-1 includes opcode OP6=1 to enable RDQS early mode and OP7=1 to enable WCK-CK fast synchronization mode.

The WCK/WCKF buffer of Device0 is enabled starting at time Ta2 in response to the MPC command. As shown in FIG. 11B, enablement of the WCK/WCKF input buffer for Device0 occurs over a time period WCKENL between times Ta2 and Ta6 (as represented in FIG. 11B by the WCK IB enable for Rank0 becoming active around time Ta6). The controller 10 provides a static WCK signal following the WCK/WCKF input buffer of Device0. In particular, starting at time Ta6, the WCK signal remains static (at the low clock level) for the static period tWCKPREstatic between times Ta6 and Ta9. At time Ta9, an active WCK signal provided by the controller 10 is received by Device0. Device0 performs WCK-CK synchronization and generates internal clock signals based on the WCK signal that are used to provide the RDQS signal.

At time Ta11, or within a time period tWCKDQO of time Ta11, the Device0 provides the active RDQS signal to the controller 10. The Device0 also provides data DQ within a time period tWCKDQO of time Ta17. The data DQ is provided from the Device0 synchronized with the RDQS signal such that a bit of data DQ is provided for each clock edge of the RDQS signal until a data burst is complete (e.g., a 16-bit data burst is shown in FIG. 10A). The input buffer for Device0 is disabled around time Ta20, as represented in FIG. 11A by the WCK IB enable for Rank0 becoming inactive around time Ta20.

In comparison to the timing of FIG. 11A, the number of clock cycles of the RDQS signal in FIG. 11B is fewer before data is provided by Device0. The timing of FIG. 11B has 12 fewer clock cycles of the RDQS signal than for the timing of FIG. 11A (e.g., 36 clock cycles versus 24 clock cycles). The fewer clock cycles of the RDQS signal may reduce power consumption where clock cycles in excess of those provided between times Ta11 and Ta17 are unnecessary for the controller 10 to operate properly.

The select signal CS1 is active at time Ta13 to select the Device1 so that a read command READ is received by Device1 for a rising clock edge of the CK signal at time Ta13. With a read latency of 17 tCKs, data for the READ command at time Ta13 will be provided by Device1 following time Ta30. The select signal CS1 is active again at time Ta15 so that a MPC command is received by the Device1 (Rank1). The MPC command at time Ta15 includes opcode OP6=1 to enable RDQS early mode and OP7=1 to enable WCK-CK fast synchronization mode.

The WCK/WCKF buffer of Device1 is enabled starting at time Ta15 in response to the CAS command. Enablement of the WCK/WCKF input buffer for Device1 occurs over a time period WCKENL between times Ta15 and Ta19 (as represented in FIG. 11B by the WCK IB enable for Rank1 becoming active around time Ta19). The controller 10 provides a static WCK signal following the WCK/WCKF input buffer of Device1. In particular, starting at time Ta19, the WCK signal remains static (at the low clock level) for the static period tWCKPREstatic between times Ta19 and Ta22. At time Ta22, an active WCK signal provided by the controller 10 is received by Device1. Device1 performs WCK-CK synchronization and generates internal clock signals based on the WCK signal that are used to provide the RDQS signal.

At time Ta24, or within a time period tWCKDQO of time Ta24, the Device1 provides the active RDQS signal to the controller 10. The Device1 provides data DQ within a time period tWCKDQO of time Ta30. The data DQ is provided from the Device1 synchronized with the RDQS signal such that a bit of data DQ is provided for each clock edge of the RDQS signal until a data burst is complete (e.g., a 16-bit data burst is shown in FIG. 11B). The input buffer for Device1 is disabled around time Ta33, as represented in FIG. 11B by the WCK IB enable for Rank1 becoming inactive around time Ta33.

Significantly, the READ command is received by Device1 earlier for the timing of FIG. 11B than for the timing of FIG. 11A (e.g., time Ta13 versus time Ta16). As a result, data may be provided by Device1 earlier for the timing of FIG. 11B than for the timing of FIG. 11A (e.g., time Ta30 versus time Ta33). Additionally, the MPC command at time Ta15 results in a reduced number of clock cycles of the RDQS signal before data is provided by Device1. The READ command may be received by Device1 earlier because the MPC command is not limited to immediately preceding an associated access command, as is the case for a CAS command. The MPC command may be received at a time before or after the associated READ command to enable the input buffer of Device1 so that unnecessary clock cycles of the RDQS signal may be avoided.

Thus, as illustrated by FIGS. 11A and 11B, by using the MPC command, Device1 may provide data sooner than when using a CAS command (e.g., FIG. 11A) and unnecessary clock cycles of the RDQS signal may be avoided by timing the MPC command accordingly.

While the previous embodiments of FIGS. 6-11 have been described in the context of read operations, embodiments of the disclosure may also be applied in the context of other memory access operations. For example, the use of the MPC and CAS commands may be used for write operations. Rather than receiving read commands from the controller and providing data to the controller, Device0 and Device1 receive write commands from the controller and receive data from the controller to be stored in memory.

FIGS. 6-11 illustrate the flexibility provided by using MPC commands to perform access operations, for example, including single rank access operations and rank-to-rank access operations, to accommodate different clock frequencies of the CK signal. Unlike the CAS command that immediately precedes an associated access command (e.g., READ command, WRITE command, etc.), the MPC command may be provided and received at times separated from (e.g., not immediately preceding or following) an associated access command. As previously illustrated and described, the MPC command may precede an associated access command or may follow an associated access command, and may be separated in time from the associated access command by at least one clock cycle of a system clock signal (e.g., the CK signal). However, the MPC command may also immediately precede an associated access command or may also immediately follow an associated access command. As a result, the MPC command may be used to provide flexible timing.

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. An apparatus, comprising:
    a data clock path including an input buffer, the input buffer configured to receive a data clock signal when enabled and the data clock path configured to provide an internal clock signal based on the data clock signal;
    an input/output circuit configured to receive an internal clock signal from the data clock path and provide an access data clock signal based on the internal clock signal;
    a command input circuit configured to receive access commands and timing commands associated with the access commands, and further configured to provide internal access commands responsive to receiving the access commands, to provide an internal first timing command responsive to receiving a first timing command of the timing commands, and to provide an internal second timing command responsive to receiving a second timing command of the timing commands;
    a command decoder coupled to the command input circuit and configured to decode the internal access commands and provide internal access control signals to perform corresponding access operations and further configured to decode the internal first and second timing commands and provide internal timing control signals to enable the input buffer of the data clock path and to control the input/output circuit to provide the access data clock signal.

2. The apparatus of claim 1 wherein each timing command is associated with a respective access command.

3. The apparatus of claim 1 wherein the first timing command and the second timing command each includes opcodes.

4. The apparatus of claim 3 wherein the opcodes includes a first opcode for a clock synchronization mode and includes a second opcode for an access data clock mode.

5. The apparatus of claim 1 wherein the access command comprises a read command.

6. The apparatus of claim 1 wherein the second timing command is limited to immediately preceding the associated access command.

7. The apparatus of claim 1 wherein the first command decoder is configured to provide internal timing control signals to enable the input buffer of the data clock path responsive to the first timing command following the associated access command.

8. The apparatus of claim 1 wherein the data clock path comprises a clock divider circuit configured to provide multiphase clock signals based on the data clock signal.

9. The apparatus of claim 8 wherein the input/output circuit comprises a clock circuit configured to provide an internal access data clock signal based on the multiphase clock signals.

10. The apparatus of claim 1, further comprising a clock path configured to receive a system clock signal and provide internal system clock signals.

11. An apparatus, comprising:
    a command bus;
    an address bus;
    a data bus;
    a clock bus;
    a controller configured to provide access commands and timing commands to the command bus, addresses to the address bus, and a data clock signal to the clock bus; and
    a memory system including a plurality of memories coupled to the controller through the command, address, data, and clock busses, and the memory system configured to provide data to the data bus having a timing based on a timing of corresponding access commands and further configured to provide an access data clock signal having a timing based on a timing of the timing commands, wherein a timing command associated with a respective access command is separated in time from the respective access command by at least one clock cycle of a system clock signal,
    wherein the controller is configured to:
    provide a first timing command to a first memory of the plurality of memories to enable an input buffer of the first memory;
    provide a second timing command to a second memory of the plurality of memories to enable an input buffer of the second memory;
    provide to the first memory a first access command associated with the first timing command;

provide an active data clock signal to the first and second memories; and provide to the second memory a second access command associated with the second timing command, wherein the second timing command and the second access command are separated in time by at least one clock cycle of the system clock signal.

12. The apparatus of claim 11 wherein the memory system comprises a plurality of memories, each memory of the plurality of memories coupled to the command, address, data, and clock busses.

13. The apparatus of claim 12 wherein the plurality of memories of the memory system are organized as ranks of memory.

14. The apparatus of claim 11, further comprising a plurality of select signal lines wherein each select signal line of the plurality of select signal lines is coupled to a respective one of the plurality of memories of the memory system.

15. The apparatus of claim 11 wherein:
the first memory is configured to:
  generate a first access data clock signal at the first memory, wherein the first access data clock signal is based on the active data clock signal;
  provide the first access data clock signal; and
  provide first data from the first memory responsive to the first access command; and
the second memory is configured to:
  generate a second access data clock signal at the second memory, wherein the second access data clock signal is based on the active data clock signal;
  provide the second access data clock signal; and
  provide second data from the second memory responsive to the second access command.

16. A method, comprising:
receiving a system clock signal;
enabling an input buffer of a first memory responsive to receiving a first timing command;
enabling an input buffer of a second memory responsive to receiving a second timing command;
receiving at the first memory a first access command associated with the first timing command;
receiving at the first and second memories an active data clock signal;
receiving at the second memory a second access command associated with the second timing command, wherein the second timing command and the second access command are separated in time by at least one clock cycle of the system clock signal;
generating a first access data clock signal at the first memory, wherein the first access data clock signal is based on the active data clock signal;
providing the first access data clock signal;
providing first data from the first memory responsive to the first access command;
generating a second access data clock signal at the second memory, wherein the second access data clock signal is based on the active data clock signal;
providing the second access data clock signal; and
providing second data from the second memory responsive to the second access command.

17. The method of claim 16 wherein the first and second timing commands are the same type of timing of command.

18. The method of claim 16 wherein the first and second timing commands are two different types of timing commands.

19. The method of claim 16, further comprising:
receiving an active first select signal when receiving the first timing command and the first access command; and
receiving an active second select signal when receiving the second timing command and the second access command.

20. The method of claim 16 wherein the second timing command is received at the second memory before the first timing command is received at the first memory.

21. The method of claim 20 wherein the first timing command immediately precedes the first access command.

22. The method of claim 20, further comprising receiving a third timing command associated with the second access command, wherein a timing of the providing of the second access data clock signal is based on the third timing command.

23. The method of claim 22 wherein the third timing command is received after the second access command.

24. The method of claim 22 wherein the third timing command is separated in time by at least one clock cycle.

25. A method, comprising:
providing a first timing command to a first memory;
providing a first access command to the first memory, wherein the access command is associated with the first timing command;
waiting at least one clock cycle of a system clock signal between providing the first timing and first access commands to the first memory;
providing a second timing command to a second memory before providing the first access command;
providing a second access command to the second memory, wherein the second access command is associated with the second timing command;
providing a third timing command associated with the second timing command, wherein the first timing command and the third timing command includes opcodes enabling a fast synchronization mode and enabling an early access data clock signal mode;
providing a data clock signal at a time relative to the providing of the first timing command;
receiving an access data clock signal based on the data clock signal; and
receiving data synchronized with the access data clock signal.

26. The method of claim 25 wherein the timing command is provided before the access command.

27. The method of claim 25 wherein the timing command is provided after the access command.

* * * * *